(12) United States Patent
Takemura

(10) Patent No.: US 8,743,591 B2
(45) Date of Patent: Jun. 3, 2014

(54) SEMICONDUCTOR MEMORY DEVICE AND METHOD FOR DRIVING THE SAME

(75) Inventor: Yasuhiko Takemura, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 85 days.

(21) Appl. No.: 13/449,456

(22) Filed: Apr. 18, 2012

(65) Prior Publication Data

US 2012/0275213 A1    Nov. 1, 2012

(30) Foreign Application Priority Data

Apr. 26, 2011 (JP) ................................ 2011-097821

(51) Int. Cl.
*G11C 11/24* (2006.01)
(52) U.S. Cl.
USPC ...................................... 365/149; 365/230.03
(58) Field of Classification Search
USPC ............................................ 365/149, 230.03
See application file for complete search history.

(56) References Cited

U.S. PATENT DOCUMENTS

| | | | |
|---|---|---|---|
| 5,353,255 A | 10/1994 | Komuro | |
| 5,430,672 A | 7/1995 | Kuwabara et al. | |
| 5,495,440 A | 2/1996 | Asakura | |
| 5,610,868 A | 3/1997 | Inaba et al. | |
| 5,764,562 A | 6/1998 | Hamamoto | |
| 5,802,000 A | 9/1998 | Hamada | |
| 6,775,175 B2 * | 8/2004 | Thomas | 365/149 |
| 6,795,351 B2 * | 9/2004 | Sakai | 365/189.09 |
| 6,809,951 B2 * | 10/2004 | Yamaguchi | 365/145 |
| 7,167,386 B2 * | 1/2007 | Matsushita | 365/145 |
| 7,684,229 B2 * | 3/2010 | Leung | 365/149 |
| 7,939,890 B2 * | 5/2011 | Yamauchi | 257/347 |
| 8,300,461 B2 * | 10/2012 | Lin et al. | 365/185.05 |
| 8,508,994 B2 * | 8/2013 | Okhonin | 365/185.08 |

OTHER PUBLICATIONS

Motoyuki Oishi; "DRAM Makers Cut Cost by 30% a Year to 2011"; Dec. 19, 2007; http://techon.nikkeibp.co.jp/article/HONSHI/20071219/144399/ (5 pages).

Takeshi Hamamoto et al.; "Cell-Plate-Line/Bit-Line Complementary Sensing (CBCS) Architecture for Ultra Low-Power DRAM's"; IEEE Journal of Solid-State Circuits; Apr. 1996; pp. 592-601; vol. 31, No. 4.

* cited by examiner

*Primary Examiner* — Michael Tran
(74) *Attorney, Agent, or Firm* — Fish & Richardson P.C.

(57) ABSTRACT

In a semiconductor memory device, one electrode of a capacitor is connected to a bit line, and the other electrode of the capacitor is connected to a drain of a cell transistor. A source of the cell transistor is connected to a source line. When a stack capacitor, for example, is used in this structure, one electrode of the capacitor is used as part of the bit line. An impurity region formed on the semiconductor substrate or a wiring parallel to a word line can be used as the source line; thus, the structure of a DRAM is simplified.

20 Claims, 22 Drawing Sheets

101 Memory Cell
102 Cell Transistor
103 Capacitor
104a/104b Word Lines
105 Bit Line
106 Source Line
107 First Parasitic Capacitance
108 Second Parasitic Capacitance 201 Memory Cell
202 Cell Transistor
203 Capacitor
204a/204b Word Lines
205 Bit Line
206 Source Line

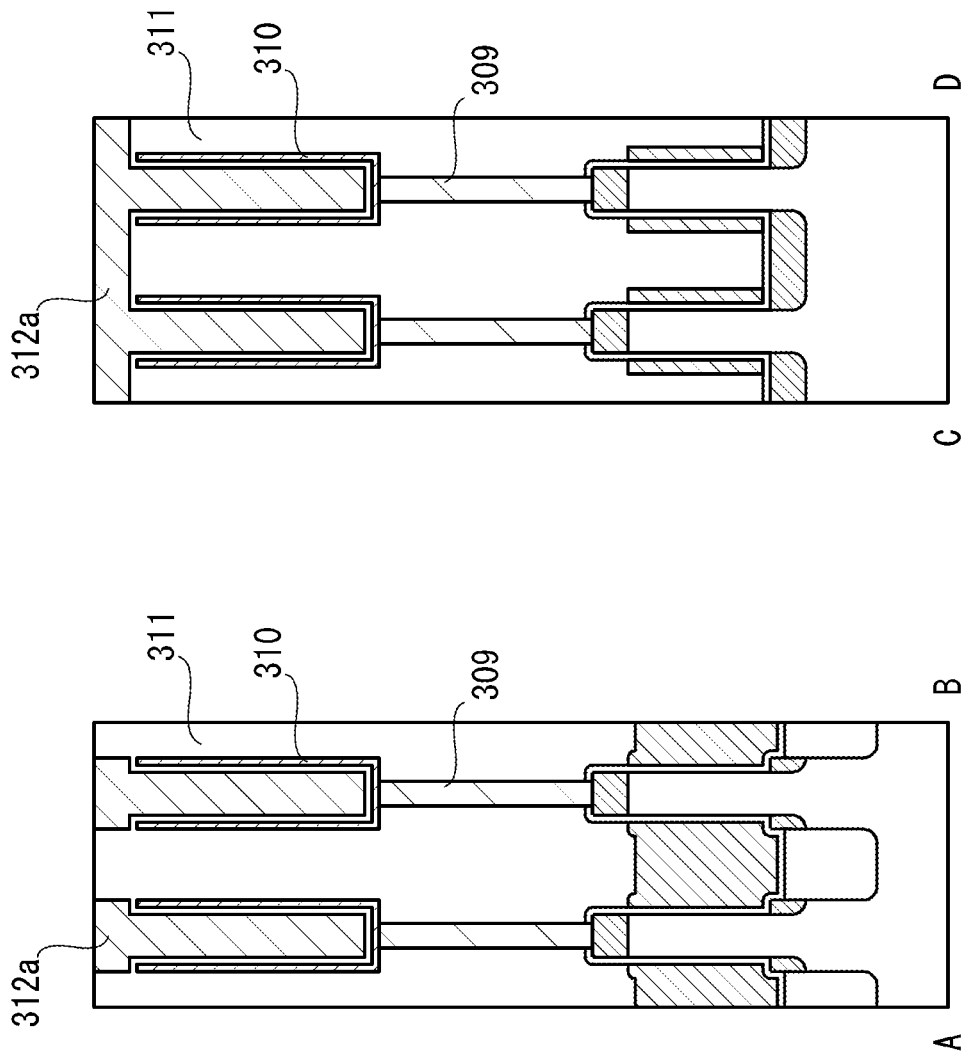

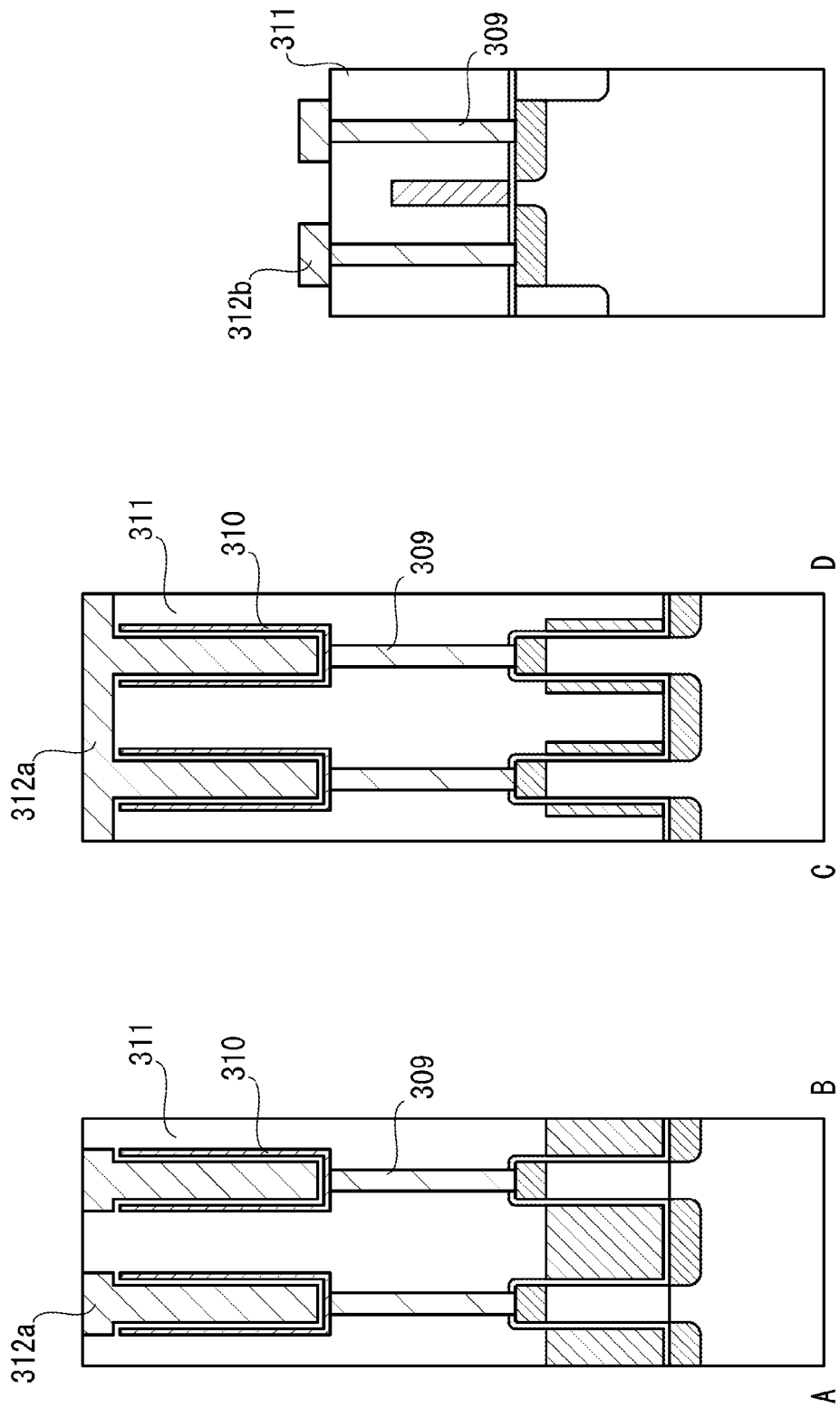

SEMICONDUCTOR MEMORY DEVICE AND METHOD FOR DRIVING THE SAME

BACKGROUND OF THE INVENTION

1. Field of the Invention

The present invention relates to a memory device including a semiconductor.

2. Description of the Related Art

A DRAM whose memory cell includes one transistor and one capacitor has no limit on the number of times of writing in principle, and can perform writing and reading at relatively high speed; thus, such a DRAM is used in many kinds of electronic apparatuses. A DRAM stores data by accumulating electric charge in a capacitor of each memory cell, and reads the data by releasing the electric charge (see Patent Documents 1 to 6 and Non-Patent Document 1).

DRAMs are classified into a folded bit line type and an open bit line type according to a layout of bit lines and memory cells. The area of one memory cell (cell area) of the folded bit line type DRAM is 8 $F^2$ (F indicates a feature size) at the minimum. On the other hand, the cell area of the open bit line type DRAM can be reduced down to 6 $F^2$ in the case of using a planar transistor, or 4 $F^2$ in the case of using a vertical transistor. For improving integration degree, the open bit line type DRAM has been employed.

FIG. 2A is a circuit diagram of a conventional DRAM memory cell. A memory cell 201 includes a cell transistor 202 and a capacitor 203. A gate of the cell transistor 202 is connected to a word line 204a, a drain of the cell transistor 202 is connected to a bit line 205, and a source of the cell transistor 202 is connected to a first electrode (capacitor electrode) of the capacitor 203. A second electrode of the capacitor 203 is connected to a source line 206.

Memory cells with the same configuration are arranged in a matrix. A gate of a cell transistor of a memory cell adjacent to the memory cell 201 is connected to a word line 204b which is adjacent to the word line 204a. The word line 204a and the word line 204b intersect with the bit line 205.

Data is written in the memory cell 201 in the following manner. The potential of the word line 204a is controlled to turn on the cell transistor 202, and the potential of the bit line 205 is set in accordance with data to charge the capacitor 203. Then, the potential of the word line 204a is controlled to turn off the cell transistor 202. At this time, the connection point (storage node SN) of the source of the cell transistor 202 and the first electrode of the capacitor 203 has a potential corresponding to data.

Data is read from the memory cell 201 in the following manner. The potential of the word line 204a is controlled to turn on the cell transistor 202, and charge accumulated in the capacitor 203 is released to the bit line 205 in a floating state. At this time, the potential of the bit line 205 varies in accordance with the charge accumulated in the capacitor 203. Data can be read by amplification of this variation.

In order to prevent occurrence of an error during data reading, the capacitance of the capacitor 203 is required to be sufficiently larger than the gate capacitance of the cell transistor 202. During data reading, the bit line 205 is in a floating state. When the cell transistor 202 is turned on with the bit line 205 in that state, the word line 204a and the bit line 205 are capacitively coupled via the gate capacitance of the cell transistor 202, so that the potential of the bit line 205 varies.

This variation in potential is pronounced when the capacitance of the capacitor 203 is smaller than the gate capacitance of the cell transistor 202. In particular, when the capacitance of the capacitor 203 is less than or equal to ten times the gate capacitance of the cell transistor 202, a margin of data reading becomes small, leading to an error.

FIG. 2B illustrates a cross section of a DRAM including a stack capacitor. The DRAM includes an element isolation region 212 formed on a substrate 211, impurity regions 213a, 213b, and 213c formed on the substrate 211, word lines 204a and 204b, a bit line 205, capacitor electrodes 215a and 215b, and a source line 206 (also referred to as cell plate). An interlayer insulator 216 is provided between the word lines 204a and 204b and the source line 206.

The bit line 205 is connected to the impurity region 213b via a connection electrode 214b, the capacitor electrode 215a is connected to the impurity region 213a via a connection electrode 214a, and the capacitor electrode 215b is connected to the impurity region 213c via a connection electrode 214c. A stack capacitor is formed by the capacitor electrodes 215a and 215b and the source line 206.

In the case of using the circuit illustrated in FIG. 2A, it is necessary that the capacitor 203 and the bit line 205 are provided above the word lines 204a and 204b (the side of the word lines opposite to the substrate) and the bit line 205 intersects with the word lines 204a and 204b. In addition, the bit line 205 needs to be provided so as not to contact with the capacitor.

Therefore, in the open bit line type DRAM, a bit line needs to be provided not to be in contact with the connection electrodes 214a and 214c connected to the stack capacitors, as described in Patent Document 3.

In the folded bit line type DRAM, arrangement of a bit line is easy owing to a large cell area. In the open bit line type DRAM, however, space to provide a bit line between capacitors is narrow down to 1 F owing to a small cell area, so that arrangement of a bit line using a general circuit layout is difficult.

For example, when a planar transistor is used, a bit line and an element formation region need to be arranged to form an angle of approximately 29°, which is difficult to set. Even in that case, the cell area can be reduced down to only approximately 6.2 $F^2$, and thus an ideal lower limit of 6 $F^2$ cannot be achieved.

When a vertical transistor is used, a bit line is embedded in a substrate (i.e., an impurity region formed on a substrate, silicide formed thereover, or the like is used as a bit line). However, the thus formed bit line has a high resistance, which causes a problem of a signal delay or heat generation.

REFERENCE

Patent Document

[Patent Document 1] U.S. Pat. No. 5,430,672
[Patent Document 2] U.S. Pat. No. 5,610,868
[Patent Document 3] U.S. Pat. No. 5,802,000
[Patent Document 4] U.S. Pat. No. 5,764,562
[Patent Document 5] U.S. Pat. No. 5,353,255
[Patent Document 6] U.S. Pat. No. 5,495,440

Non-Patent Document

[Non-Patent Document 1]
http://techon.nikkeibp.co.jp/article/HONSHI/20071219/144399/

SUMMARY OF THE INVENTION

An object of one embodiment of the present invention is to provide a DRAM and another semiconductor device each of which has a structure simpler than that of a conventional one, and driving methods thereof. Another object is to provide a DRAM and another semiconductor device each of which has integration degree higher than that of a conventional one, and driving methods thereof. Another object is to provide a DRAM and another semiconductor device each of which can be manufactured through fewer steps than those of a conventional one, and driving methods thereof.

Another object of one embodiment of the present invention is to provide a memory device having a novel structure or a method for driving the memory device. In particular, it is an object of one embodiment of the present invention to provide a memory device in which power consumption can be reduced and a method for driving the memory device.

The present invention will be described below; terms used in this specification are briefly described. First, when one of a source and a drain of a transistor is called a drain, the other is called a source in this specification. That is, they are not distinguished depending on the potential level. Therefore, a portion called a source in this specification can be alternatively referred to as a drain.

Further, when the expression "to be connected" is used in this specification, there is a case in which no physical connection is made in an actual circuit and a wiring is only extended. For example, in the case of a circuit including insulated-gate field-effect transistors (MISFETs), one wiring functions as gates of a plurality of MISFETs in some cases. In that case, one wiring which branches into gates may be illustrated in a circuit diagram. Even in such a case, the expression "a wiring is connected to a gate" may be used in this specification.

One embodiment of the present invention is a semiconductor memory device including one or more bit lines, one or more word lines, and one or more memory cells. In the semiconductor memory device, each memory cell includes one or more cell transistors and one or more stack capacitors; a gate, a drain, and a source of each cell transistor are connected to a word line, one electrode of a stack capacitor, and a source line, respectively; and the bit line is formed over the stack capacitor.

One embodiment of the present invention is a semiconductor memory device including one or more bit lines, one or more word lines, and one or more memory cells. In the semiconductor memory device, each memory cell includes one or more cell transistors and one or more stack capacitors; a gate, a drain, and a source of each cell transistor are connected to a word line, one electrode of a stack capacitor, and a source line, respectively; the other electrode of the stack capacitor is connected to a bit line; and the bit line is formed over the stack capacitor.

In any of the above structures, the source line may be formed in parallel to the word line. In that case, the source line may be connected to a wiring parallel to the bit line. Further, in any of the above structures, the number of memory cells connected to one bit line may be 20 to 1000.

In any of the above structures, the capacitance of the capacitor of the memory cell may be one to ten times a gate capacitance of the cell transistor. In that case, the off-state resistance of the cell transistor is preferably greater than or equal to $1 \times 10^{18} \Omega$.

One embodiment of the present invention is a method for driving the semiconductor memory having any of the above structures, in which a potential of the source line is invariant during data reading, data holding, and data writing.

One embodiment of the present invention is a method for driving the semiconductor memory having any of the above structures, in which there is no difference in a potential of a drain of the cell transistor between just after writing of one data and just after writing of another data, and there is no difference in a potential of a source of the cell transistor between just after writing of one data and just after writing of another data.

Examples of a semiconductor memory device and a method for driving the semiconductor device, which are each one embodiment of the present invention, will be described to explain the effects of the present invention. Note that in the following Embodiments, the effects of the present invention will be described in detail.

FIG. 1A is a circuit diagram of an example of a memory cell in a semiconductor memory device which is one embodiment of the present invention. A memory cell 101 includes a cell transistor 102 and a capacitor 103. A gate of the cell transistor 102 is connected to a word line 104a, and a source of the cell transistor 102 is connected to a source line 106. A first electrode of the capacitor 103 is connected to a drain of the cell transistor 102. A node between the capacitor 103 and the cell transistor 102 is referred to as storage node SN. A second electrode of the capacitor 103 is connected to a bit line 105.

The memory cell adjacent to the memory cell 101 has the same configuration, in which a gate of a cell transistor is connected to a word line 104b adjacent to the word line 104a. Although the source line 106 is disposed in parallel to the bit line 105 in FIG. 1A, the present invention is not limited thereto, and the source line 106 may be disposed in parallel to the word line 104a depending on a circuit layout.

In an actual memory cell, parasitic capacitances other than the capacitor 103 exist. Among such parasitic capacitances, a first parasitic capacitance 107 connected to the bit line 105 and a second parasitic capacitance 108 connected to the storage node SN in FIG. 1B are important in the present invention. The capacitances of the capacitor 103, the first parasitic capacitance 107, and the second parasitic capacitance 108 are referred to as C1, C2, and C3, respectively. The details thereof will be described below.

FIG. 3 illustrates a state in which a plurality of memory cells is connected to the bit line 105. In FIG. 3, a circle on a transistor indicates that the transistor is in an on state, and a cross mark on a transistor indicates that the transistor is in an off state. In a memory cell in which a cell transistor is in an on state, the second parasitic capacitance is not formed in the circuit.

On the other hand, since cell transistors are in an off state in the other memory cells, a parasitic capacitance between the capacitor and the second parasitic capacitance connected in series is formed in the circuit. In one memory cell, the total capacitance is represented by $C1*C3/(C1+C3)$. When $C3 \ll C1$, the total capacitance can approximate C3.

Although depending on a capacitor structure, in the case of using a stack capacitor, a main factor of the second parasitic capacitance is a capacitance generated between the capacitors 103. When the height of the capacitors 103 increases, the area of regions where the capacitors 103 face each other also increases in proportion to the capacitor 103; therefore, in general, the capacitance C3 of the second parasitic capacitance is proportional to the capacitance C1 of the capacitor 103. In general, a capacitance generated between adjacent capacitors is 1% to 10% of the capacitance C1 of the capacitor 103.

Note that the sum of total capacitances described above per bit line may be too large to ignore the influence of the total capacitances. When n memory cells are connected to a bit line, the capacitance formed of the bit line 105 including the first parasitic capacitance is represented by the following formula.

$$C4=C2+(n-1)*C1*C3/(C1+C3) \quad \text{(Formula 1)}$$

For example, when n=1000 and C1 is 50 times as large as C3, the second term of this formula is approximately 20 times as large as C1; therefore, full consideration is needed because the capacitance formed of the bit line 105 involves variation in potential of a bit line during data reading.

As in a conventional DRAM, in a semiconductor memory device which is one embodiment of the present invention, the variation in potential of a bit line is utilized for data reading. The variation becomes larger as the ratio of the capacitance C1 to the capacitance C4 (C1/C4) is larger. Generally, when the ratio C1/C4 is lower than 1/10, an error occurs during data reading.

In one embodiment of the present invention, the upper limit of the number of memory cells which can be connected to a bit line can be determined in accordance with the ratio of the capacitance C1 to the capacitance C3 (C1/C3). For example, when the ratio C1/C3 is 50, the second term of Formula 1 is represented by the following formula.

$$1/51*(n-1)*C1 \quad \text{(Formula 2)}$$

Since the value of Formula 2 needs to be less than or equal to ten times as large as C1, it is necessary at the very least that n is 511 or smaller. The value of n becomes smaller depending on the value of C2.

Next, using FIGS. 4A to 4D, a brief description will be given below of examples of methods of data writing and data reading of the memory cell 101 having the circuit configuration in FIG. 1B. Note that specific values of potentials and the like are given below for easy understanding, but the present invention is not limited thereto.

Here, when data is "1", the potential of the bit line 105 is +1 V, and when data is "0", the potential of the bit line 105 is 0 V. The potential of a source of the cell transistor 102 (which is connected to the source line 106) is fixed at +1 V.

The total capacitance C4 which is obtained by combining the capacitance C2 of the first parasitic capacitance 107 and the capacitance C3 of the second parasitic capacitance 108 is four times as large as the capacitance C1 of the capacitor 103. Note that in the memory cell 101, the capacitance C3 of the second parasitic capacitance 108 is sufficiently smaller than the capacitance C1 of the capacitor 103. Therefore, the capacitance C3 hardly involves variation in the storage node SN and is not shown in FIGS. 4A to 4D.

First, the potential of the word line 104a is controlled to turn on the cell transistor 102. The potential of the bit line 105 is set to 0 V. The potential of the storage node SN is +1 V. A potential difference is generated between electrodes of the capacitor 103, so that charge corresponding to the potential difference is stored in the first electrode of the capacitor 103 (see FIG. 4A).

Then, the potential of the word line 104a is controlled to turn off the cell transistor 102. The charge stored in the first electrode of the capacitor 103 is then stored in the storage node SN. In this manner, data writing is completed. In this state, when the potential of the bit line 105 is increased from 0 V to +1 V, since capacitive coupling via the capacitor 103 is formed, the potential of the storage node SN is increased by 1 V to become +2 V (see FIG. 4B).

Similarly, when the potential of the bit line 105 is +0.5 V (i.e., a potential higher than the potential of the bit line 105 during data writing by 0.5 V), the potential of the storage node SN becomes +1.5 V (see FIG. 4C).

After that, the bit line 105 is set in a floating state. Further, the potential of the word line 104a is controlled to turn on the cell transistor 102, so that the potential of the storage node SN decreases from +1.5 V to +1 V. Consequently, the potential of the bit line 105 which forms capacitive coupling via the capacitor 103 also varies from +0.5 V.

In that case, the total capacitance C4 of the capacitance C2 of the first parasitic capacitance 107 and the capacitance C3 of the second parasitic capacitance 108 is also connected to the bit line 105, whereby a part of the variation in potential of the storage node SN becomes variation in potential of the bit line 105. Since the capacitance C4 is four times as large as the capacitance C1 of the capacitor 103, the potential of the bit line 105 decreases by 0.1 V to become +0.4 V. Data can be read by amplification of this variation.

The operations of data writing and data reading in the case where data is "0" is described above, and the description applies to the operations of data writing and data reading in the case where data is "1". In other words, data reading and data writing can be performed in a manner similar to that of a conventional DRAM. In the above, the second parasitic capacitance 108 in the memory cell 101 is not considered. As long as the capacitance C3 of the second parasitic capacitance 108 is less than or equal to 10% of the capacitance C1 of the capacitor 103, a problem in data writing and data reading does not occur.

For example, the bit line 105 is in a floating state during data reading. In that state, when the cell transistor 102 is turned on, since the capacitor 103 is provided between a node of the bit line 105 and the drain of the cell transistor 102 and the storage node SN is fixed at a certain potential, the potential of the bit line 105 cannot be influenced in principle by the potential of the word line 104a during data reading. Therefore, occurrence of an error during data reading can be reduced.

Particularly in the case where the capacitance C1 of the capacitor 103 is one to ten times as large as the gate capacitance of the cell transistor 102, reading accuracy that cannot be obtained by a conventional DRAM can be achieved. It is effective to make the capacitance of the capacitor 103 small for shortening writing time.

Note that a time taken to release charge accumulated in the capacitor 103 (or the storage node SN) is proportional to the capacitance of the capacitor 103 and proportional to the off-state resistance of the cell transistor 102. Therefore, when the capacitance of the capacitor 103 is small, the off-state resistance of the cell transistor 102 is set high in accordance with the capacitance of the capacitor 103, preferably set to greater than or equal to $1\times10^{18}\Omega$. For example, the off-state resistance is set to $1\times10^{24}\Omega$ and the capacitance C1 of the capacitor 103 is set to 1 fF, whereby data rewriting is not necessary for a year or more.

Note that with use of a stack capacitor for example, a wiring corresponding to a source line (e.g., the source line 206 in FIGS. 2A and 2B) of a memory cell in a conventional DRAM can be used as a bit line in one embodiment of the present invention. The wiring is provided high above the word line, so that the wiring is easily provided to intersect with the word line.

Moreover, in one embodiment of the present invention, a bit line (e.g., the bit line 205 in FIGS. 2A and 2B) of a memory cell in a conventional DRAM can be used as a source line. However, as apparent in the above description, in one embodiment of the present invention, it is not necessary to synchronize change in potential of the source line with change in potential of the word line or the bit line; thus, the source line is not necessarily provided to intersect with the word line or the bit line. Thus, there is no limitation on arrangement of the source line. For example, it is possible to provide the source line in parallel to the word line. Consequently, the degree of freedom for circuit design is increased, leading to higher integration.

Note that in the case where the source line is provided in parallel to the word line, the potential of the source line may be synchronized with the potential of the word line, or the potential of the source line may be changed in accordance with the potential of the word line.

Note that when the variation in potential of the source line is extremely small, the resistance of the source line per unit length may be larger than that of the bit line or the word line. For example, when the potential of the source line is fixed, charge passing through the source line is mainly charge stored in the storage node in the memory cell, as apparent from the above driving method. On the other hand, charge passing through the bit line includes charge stored in the parasitic capacitance of the bit line and the charge accumulated in the storage node in the memory cell; thus, the charge passing through the bit line is several to ten times the charge passing through the source line.

Therefore, a material having a relatively high resistance, such as tungsten, can be used for the source line. Further, the source line may be connected to a wiring for supplying a potential at regular intervals. By providing the wiring for supplying a potential used here in parallel to the bit line, the integration degree can be increased.

BRIEF DESCRIPTION OF THE DRAWINGS

In the accompanying drawings:

FIGS. 12A to 12C are diagrams illustrating the example of a process for manufacturing a semiconductor memory device of the present invention;

FIGS. 22A to 22C are diagrams illustrating the example of a process for manufacturing a semiconductor memory device of the present invention.

DETAILED DESCRIPTION OF THE INVENTION

Hereinafter, embodiments of the present invention will be described with reference to the drawings. Note that the embodiments can be implemented with various modes, and it is easily understood by those skilled in the art that modes and details can be changed in various ways without departing from the spirit and scope of the present invention. Therefore, the present invention should not be interpreted as being limited to the following description of the embodiments.

(Embodiment 1)

Figure 5A:
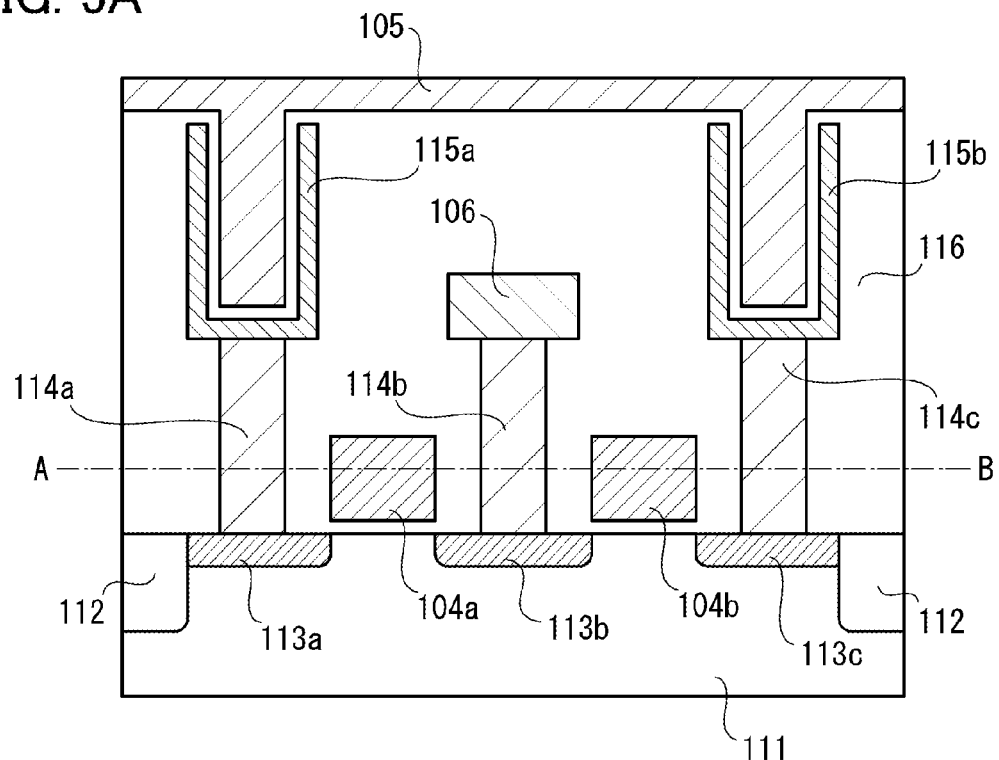
FIGS. 5A and 5B are diagrams illustrating an example of a semiconductor memory device of the present invention.

In this embodiment, a semiconductor memory device including a stack capacitor will be described with reference to FIGS. 5A and 5B. FIG. 5A illustrates a cross section of the semiconductor memory device. The semiconductor memory device includes an element isolation region 112 formed on a substrate 111, impurity regions 113a to 113c formed on the substrate 111, the word lines 104a and 104b, capacitor electrodes 115a and 115b, the bit line 105, and the source line 106. Note that the bit line 105 is formed to intersect with the word lines 104a and 104b. An interlayer insulator 116 is provided between the word lines 104a and 104b and the bit line 105.

The capacitor electrode 115a is connected to the impurity region 113a via a connection electrode 114a, the source line 106 is connected to the impurity region 113b via a connection electrode 114b, and the capacitor electrode 115b is connected to the impurity region 113c via a connection electrode 114c. A stack capacitor is formed by the capacitor electrodes 115a and 115b and the bit line 105. The impurity region 113b is connected to the source line 106 via the connection electrode 114b. The source line 106 may be provided in parallel to the word lines 104a and 104b.

Figure 1A:
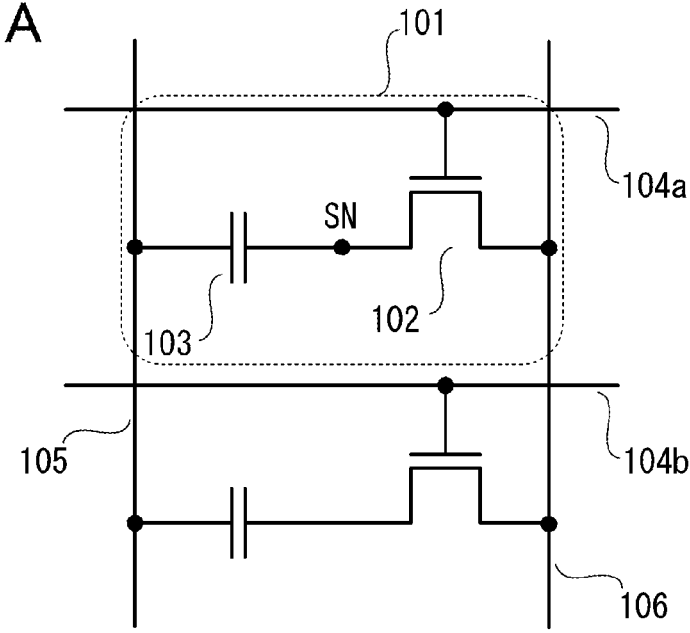
FIGS. 1A and 1B are circuit diagrams illustrating an example of a semiconductor memory device of the present invention.
Figure 1B:
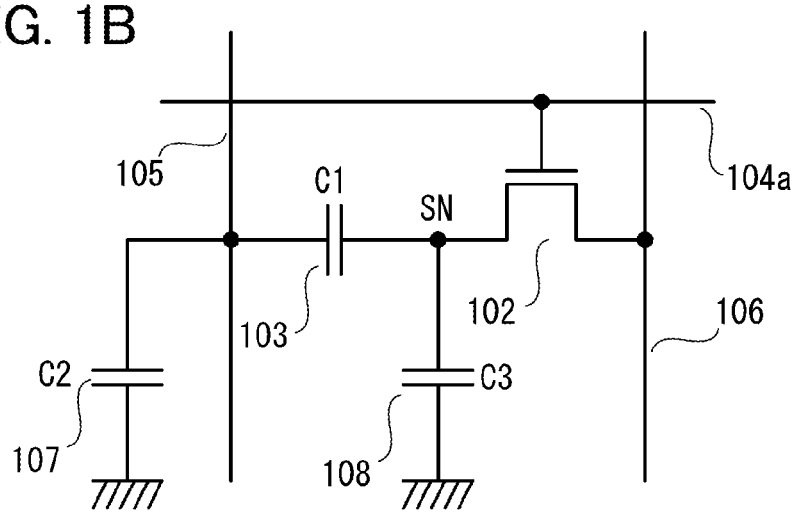
Figure 2A:
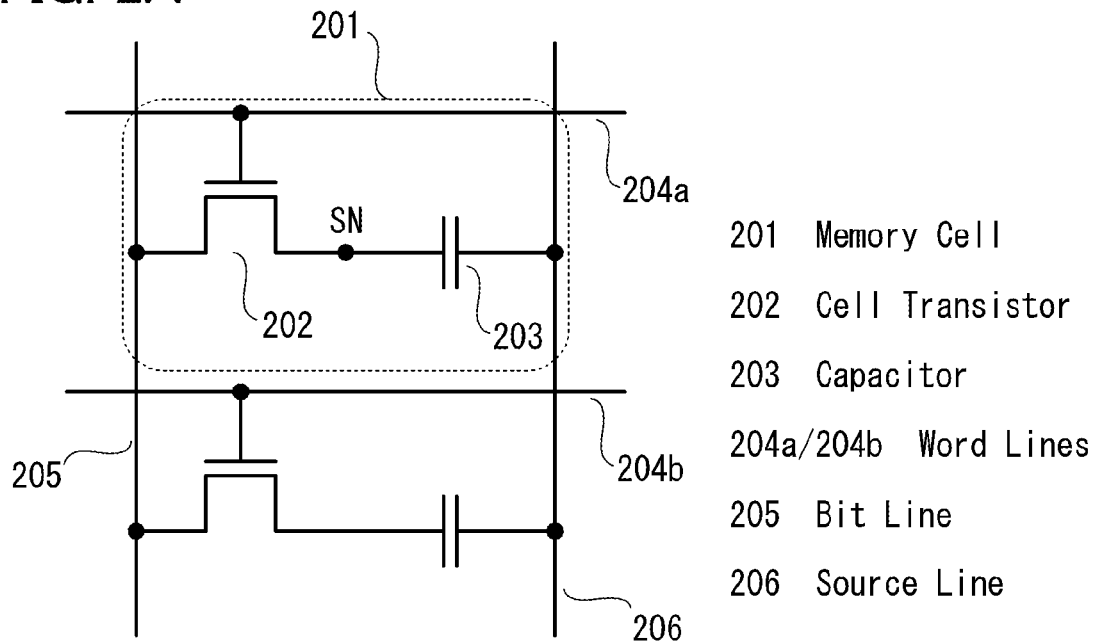
FIGS. 2A and 2B are diagrams illustrating an example of a conventional semiconductor memory device (DRAM)
Figure 2B:
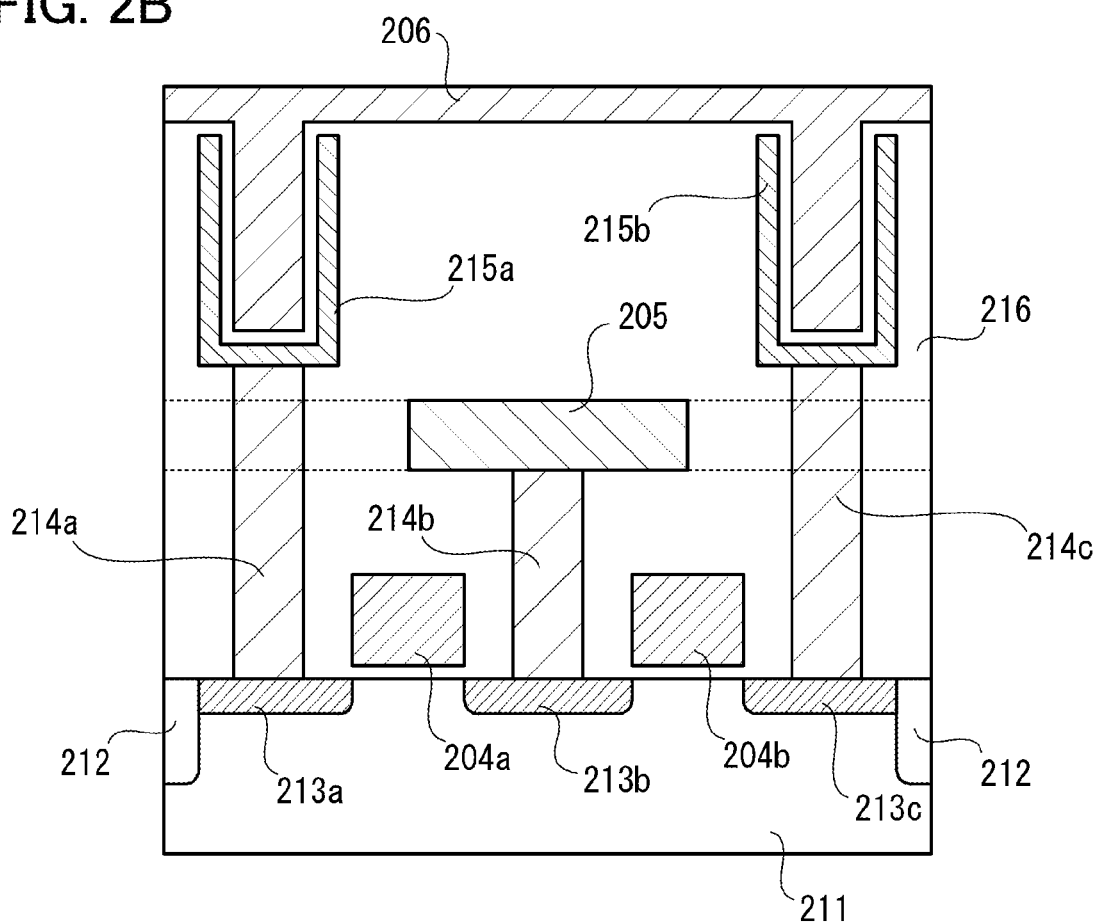
Figure 3:
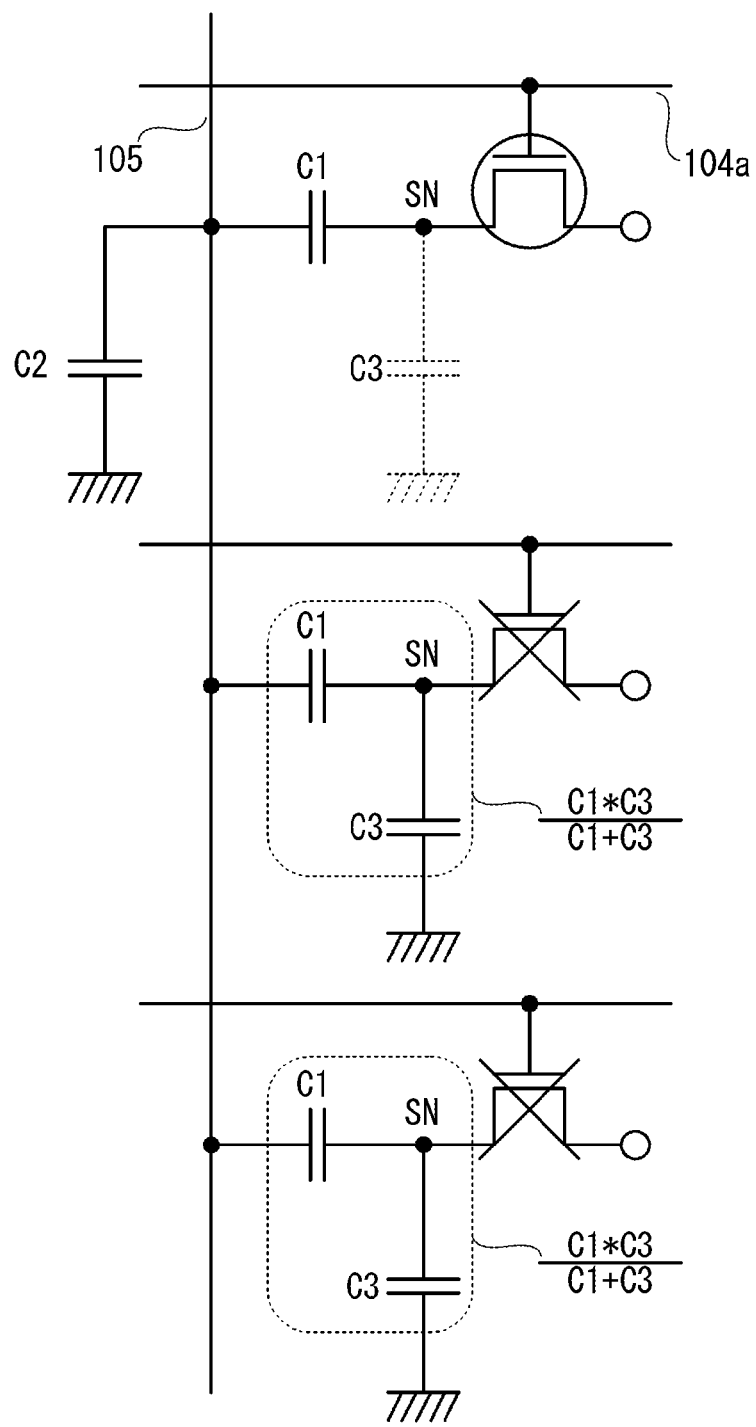
FIG. 3 is a circuit diagram illustrating an example of a semiconductor memory device of the present invention.
Figure 4A:
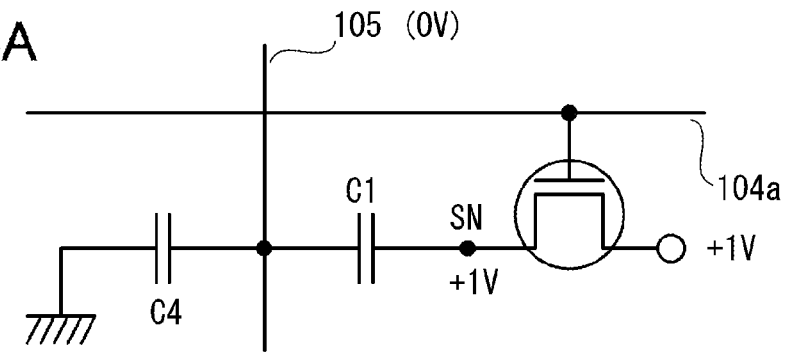
FIGS. 4A to 4D are diagrams illustrating an example of a method for driving a semiconductor memory device of the present invention.
Figure 4B:
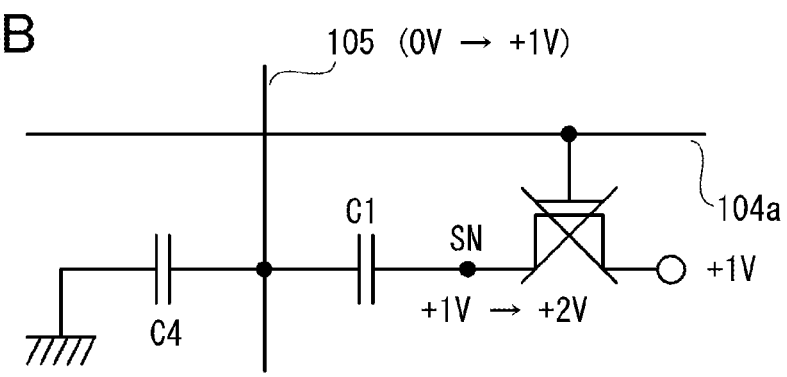
Figure 4C:
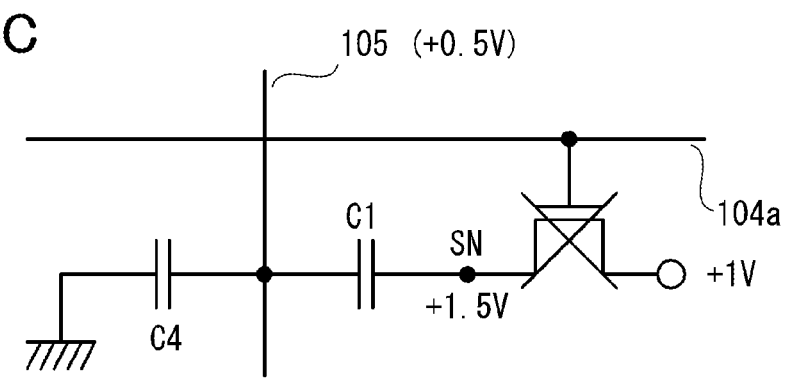
Figure 4D:
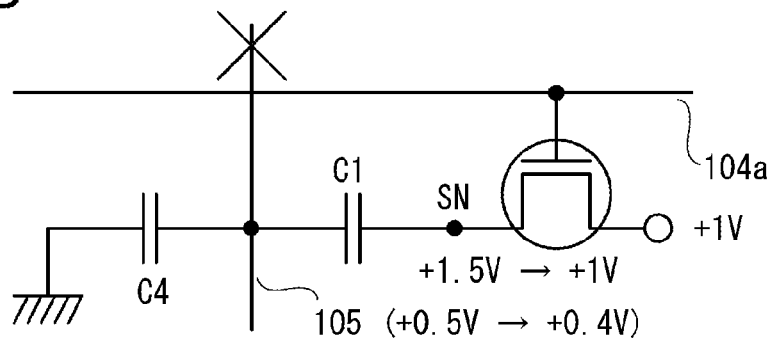

Comparing FIG. 5A with FIG. 2B, it is apparent that the bit line 205, which is needed in a conventional DRAM, is not necessary in FIG. 5A, so that the configuration is simplified; consequently, the yield and productivity are improved. The bit line 105 is provided high above the word lines 104a and 104b, so that a parasitic capacitance between the bit line 105 and the word lines 104a and 104b (or the source line 106) can be reduced.

In the DRAM illustrated in FIGS. 2A and 2B, a wiring (bit line 205) is provided below the capacitor electrodes 215a and 215b to intersect with the word lines 204a and 204b; accordingly, the lengths of the connection electrodes 214a, 214b, and 214c in the vertical direction need to be long (i.e., the aspect ratio needs to be increased).

On the other hand, in the semiconductor memory device illustrated in FIGS. 5A and 5B, there is not wiring intersecting with the word lines 104a and 104b and being below the capacitor electrodes 115a and 115b; therefore, the lengths of the connection electrodes 114a, 114b, and 114c in the vertical direction can be shorter (i.e., the aspect ratio can be reduced), leading to improvement in yield.

Figure 5B:
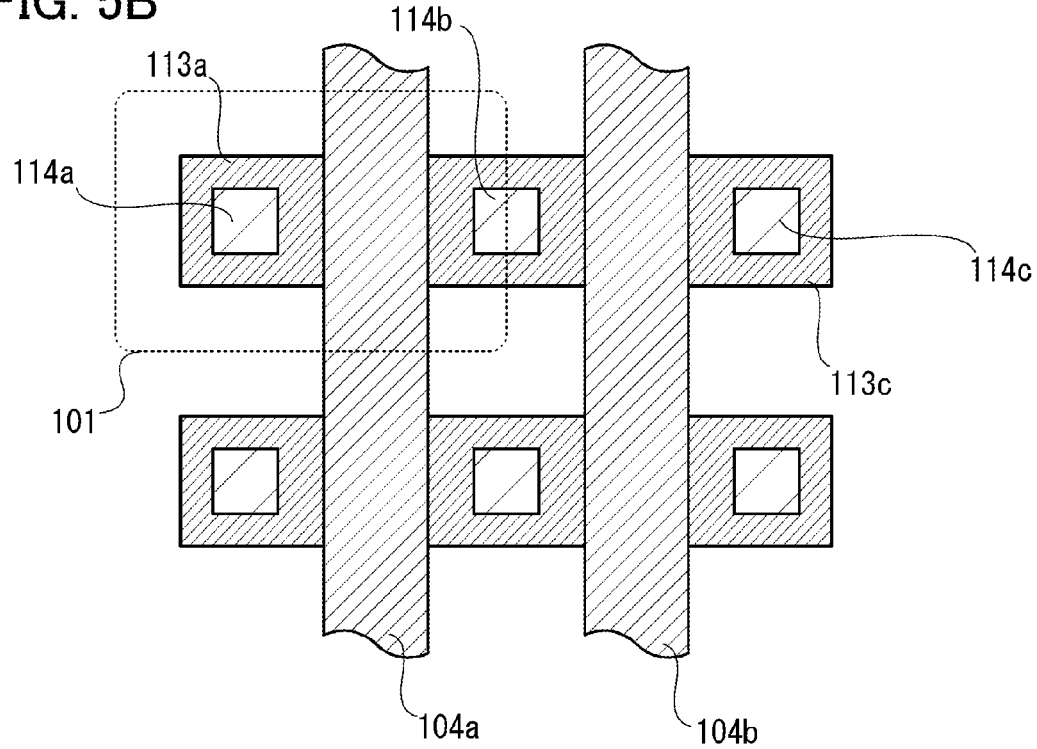

Note that in the semiconductor memory device illustrated in FIGS. 5A and 5B, the source line 106 parallel to the word lines 104a and 104b is provided in a wiring layer corresponding to the bit line 205 in the DRAM illustrated in FIGS. 2A and 2B. Owing to the above factors, the minimum cell area of the semiconductor memory device of this embodiment can be 6 $F^2$.

FIG. 5B is a schematic cross-sectional view of the semiconductor memory device illustrated in FIG. 5A taken along dashed-dotted line A-B. The memory cell 101 includes the impurity region 113a and the connection electrode 114a. The word line 104a is provided between the impurity region 113a and the impurity region 113b.

A memory cell adjacent to the memory cell 101 includes the impurity region 113c and the connection electrode 114c. The word line 104b is provided between the impurity region 113b and the impurity region 113c. The source line 106 connected to the impurity region 113b is provided between the word line 104a and the word line 104b.

Note that the resistance of the source line 106 may be lower than that of the bit line, as described above. As for a wiring having a low resistance, a time for making the potential of the wiring stable can be shortened, whereby high-speed operations of data writing and data reading can be achieved. In order to sufficiently reduce the resistance of the source line 106, for example, the circuit configuration illustrated in FIG. 6 is preferably used.

Figure 6:
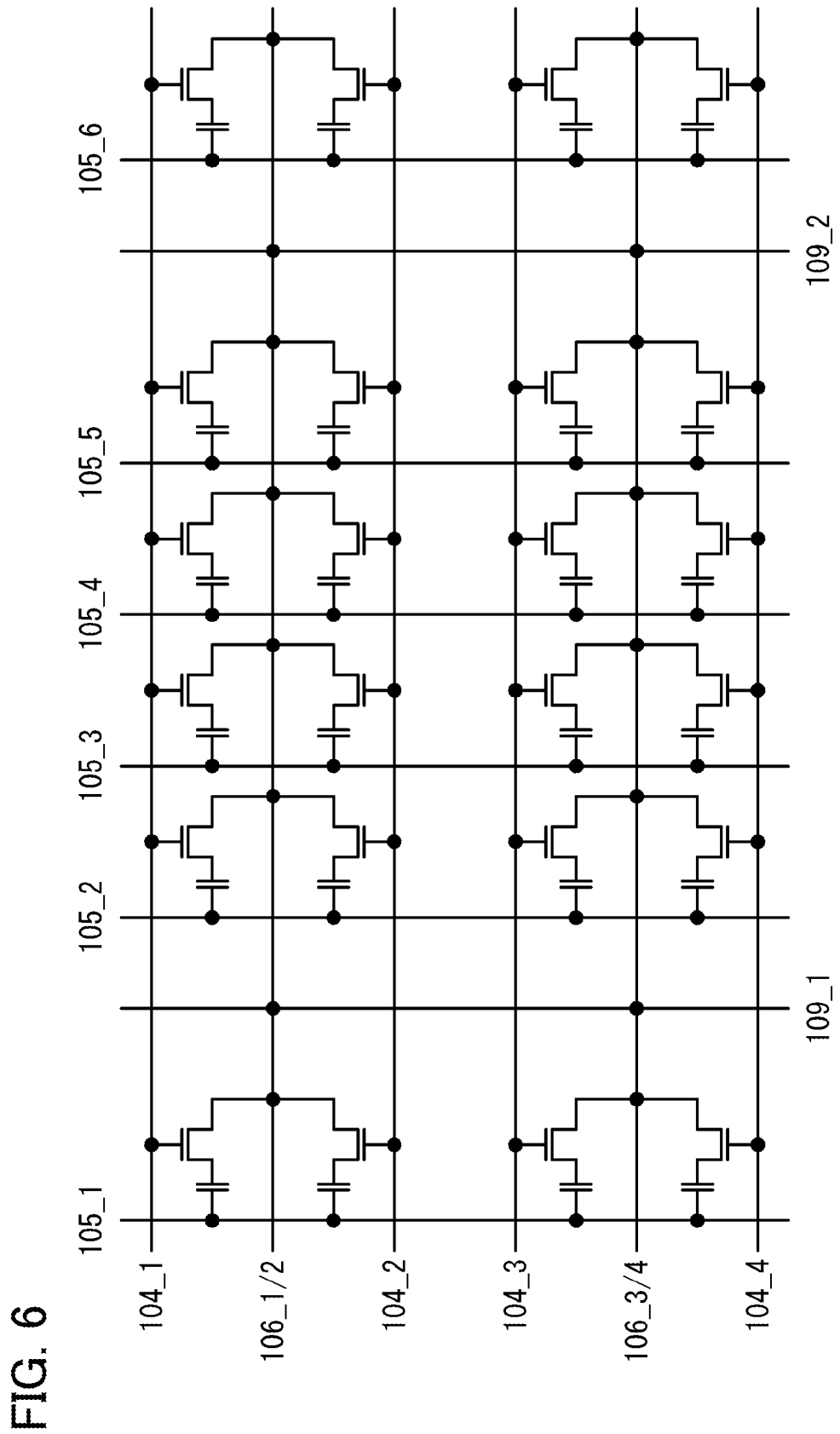
FIG. 6 is a diagram illustrating an example of a semiconductor memory device of the present invention.

FIG. 6 is a circuit diagram illustrating a semiconductor memory device including word lines 104_1 to 104_4, bit lines 105_1 to 105_6, and source lines 106_1/2 and 106_3/4 provided in parallel to the word lines.

In this circuit, a potential supply line 109_1 and a potential supply line 109_2 are provided in parallel to the bit lines. As shown in FIG. 6, one potential supply line is provided with respect to four bit lines, but the present invention is not limited to this ratio. The resistance of each of the potential supply line 109_1 and the potential supply line 109_2 per unit length is preferably similar to or less than that of the bit line.

The potential supply line 109_1 and the potential supply line 109_2 are connected to the source line 106_1/2 and the source line 106_3/4, and kept at an appropriate fixed potential. Thus, the potentials of the source line 106_1/2 and the source line 106_3/4 can be stable rapidly.

(Embodiment 2)

Figure 7A:
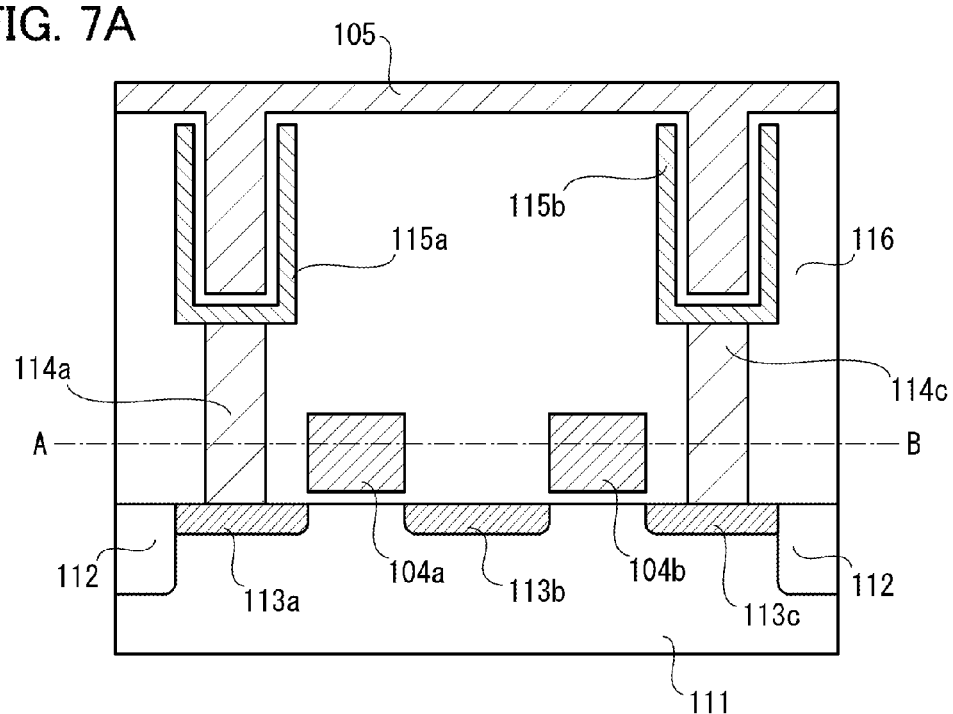
FIGS. 7A and 7B are diagrams illustrating an example of a semiconductor memory device of the present invention.

In this embodiment, a semiconductor memory device including a stack capacitor will be described with reference to FIGS. 7A and 7B. FIG. 7A illustrates a cross section of the semiconductor memory device. The semiconductor memory device includes the element isolation region 112 formed on the substrate 111, the impurity regions 113a to 113c formed on the substrate 111, the word lines 104a and 104b, the capacitor electrodes 115a and 115b, and the bit line 105. Note that the bit line 105 is formed to intersect with the word lines 104a and 104b. An interlayer insulator 116 is provided between the word lines 104a and 104b and the bit line 105.

The capacitor electrode 115a is connected to the impurity region 113a via the connection electrode 114a, and the capacitor electrode 115b is connected to the impurity region 113c via the connection electrode 114c. A stack capacitor is formed by the capacitor electrodes 115a and 115b and the bit line 105. The impurity region 113b also serves as a source line.

Comparing FIG. 7A with FIG. 2B, it is apparent that the bit line 205 and the connection electrode 214b, which are needed in a conventional DRAM, are not necessary in FIG. 7A, so that the configuration is simplified; consequently, the number of manufacturing steps is reduced and thus the productivity is improved. Further, the minimum cell area of the semiconductor memory device of this embodiment can be 6 $F^2$.

The semiconductor memory device of this embodiment corresponds to a simplified structure in which the source line 106 of the semiconductor memory device illustrated in FIGS. 5A and 5B is not provided. In particular, since the source line 106 between the word line 104a and the word line 104b is not provided, a parasitic capacitance of the word lines 104a and 104b is reduced.

Figure 7B:
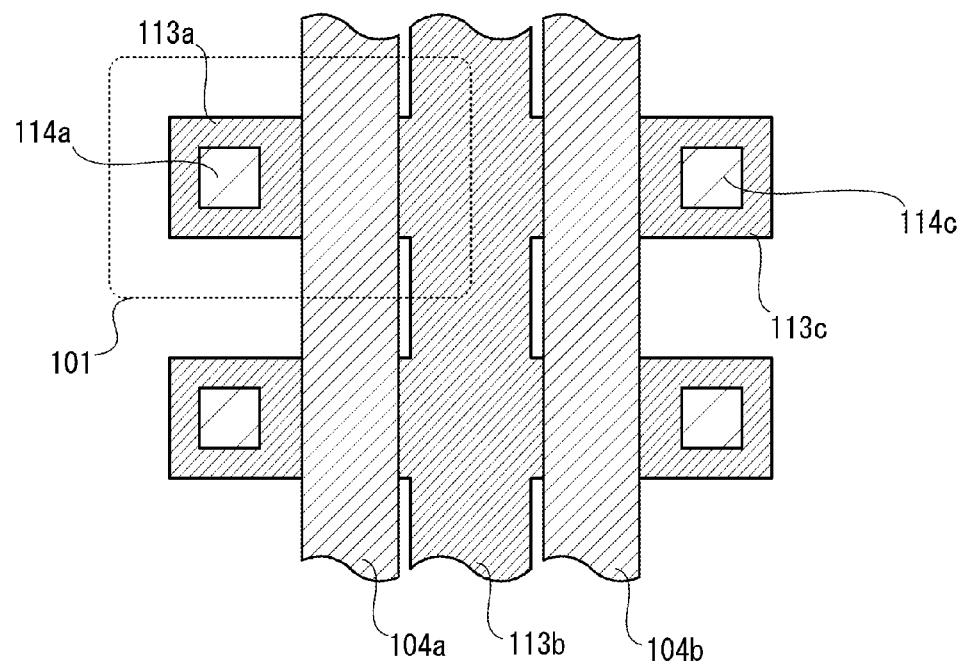

FIG. 7B is a schematic cross-sectional view of the semiconductor memory device illustrated in FIG. 7A taken along dashed-dotted line A-B. The memory cell 101 includes the impurity region 113a and the connection electrode 114a. The word line 104a is provided between the impurity region 113a and the impurity region 113b.

A memory cell adjacent to the memory cell 101 includes the impurity region 113c, is provided with the connection electrode 114c. The word line 104b is provided between the impurity region 113b and the impurity region 113c. The impurity region 113b extends in the direction parallel to the word lines 104a and 104b.

Since the impurity region 113b is used as a source line, the resistance thereof is preferably lower. Therefore, a silicide may be formed on the surface of the impurity region 113b by a known salicide (a self-aligned silicide) process.

The impurity region 113b serving as a source line may be connected at regular intervals to the potential supply line provided in parallel to the bit line in FIG. 6. Note that the structure of this embodiment and the structure of Embodiment 1 may be combined. In that case, the resistance of the source line 106 (or a wiring corresponding to the source line 106) can be further reduced.

(Embodiment 3)

Figure 8A:
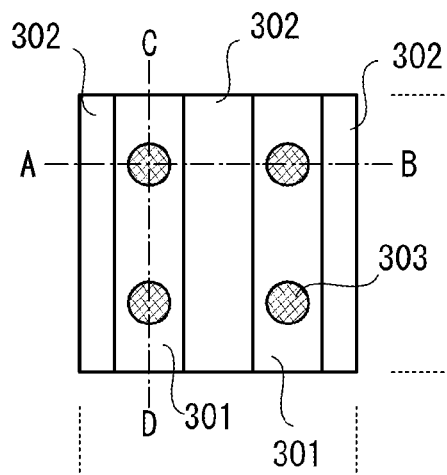
FIGS. 8A to 8D are diagrams illustrating an example of a process for manufacturing a semiconductor memory device of the present invention.
Figure 8B:
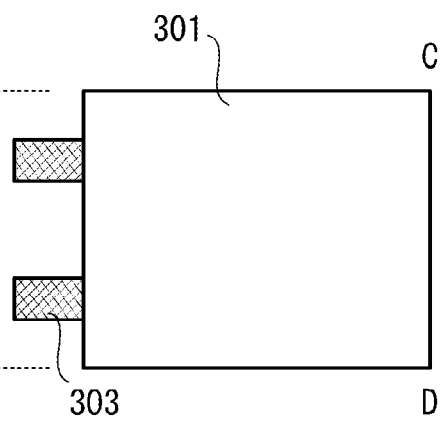
Figure 8C:
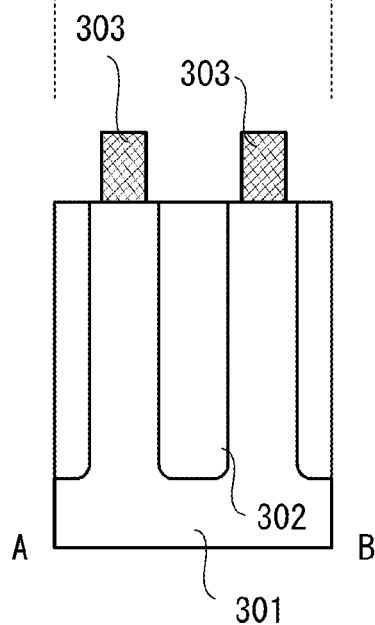
Figure 8D:
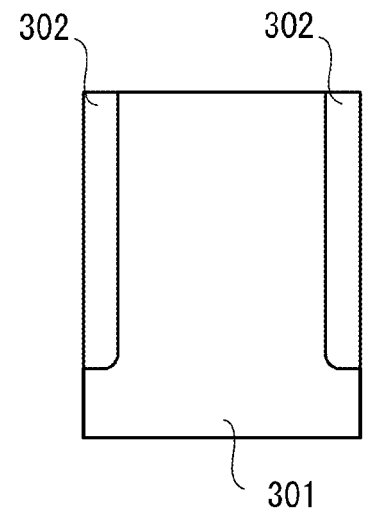

In this embodiment, a brief description is given of a method for manufacturing a semiconductor memory device using a vertical-channel transistor and having a cell area of 4 $F^2$ (F is the minimum feature size), with reference to FIGS. 8A to 8D, FIGS. 9A to 9D, FIGS. 10A to 10D, FIGS. 11A to 11D, and FIGS. 12A to 12C. Note that FIG. 8A illustrates four memory cells and the periphery thereof seen from the above. FIG. 8B illustrates a cross section taken along dashed-dotted line C-D in FIG. 8A. FIG. 8C illustrates a cross section taken along dashed-dotted line A-B in FIG. 8A. FIG. 8D illustrates a cross section of a transistor in the peripheral circuit portion. The same applies to FIGS. 9A to 9D, FIGS. 10A to 10D, and FIGS. 11A to 11D. FIG. 12A illustrates the cross section taken along dashed-dotted line A-B in FIG. 8A. FIG. 12B illustrates a cross section taken along dashed-dotted line C-D in FIG. 8A. FIG. 12C illustrates a cross section of a transistor in the peripheral circuit portion.

<FIGS. 8A to 8D>

An element isolation region 302 is formed on a substrate 301 formed with use of a semiconductor such as silicon. The substrate 301 is to be etched deeply later; thus, the element isolation region 302 needs to be formed deeply as compared with the usual semiconductor device. Further, a mask 303 is formed.

<FIGS. 9A to 9D>

Figure 9A:
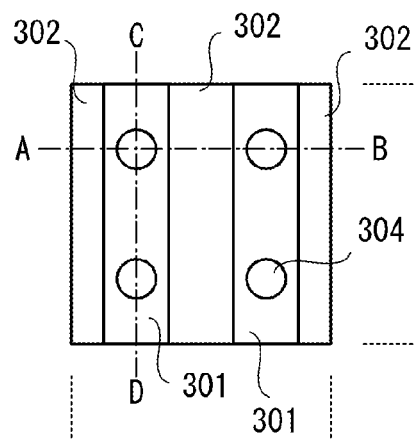
FIGS. 9A to 9D are diagrams illustrating the example of a process for manufacturing a semiconductor memory device of the present invention.
Figure 9B:
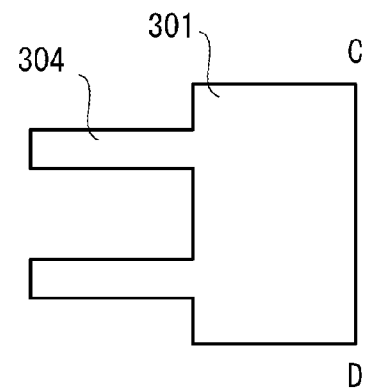
Figure 9C:
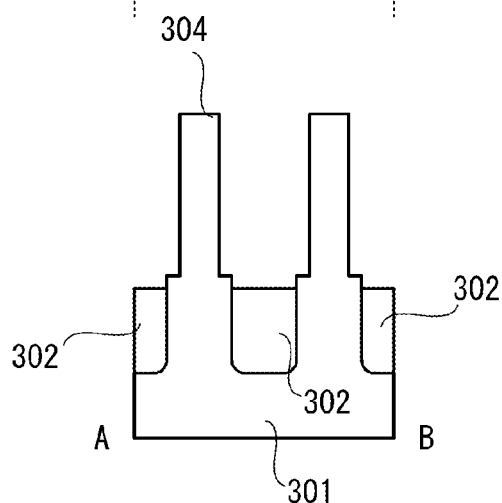
Figure 9D:
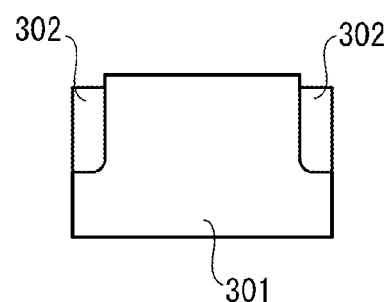
Figure 10A:
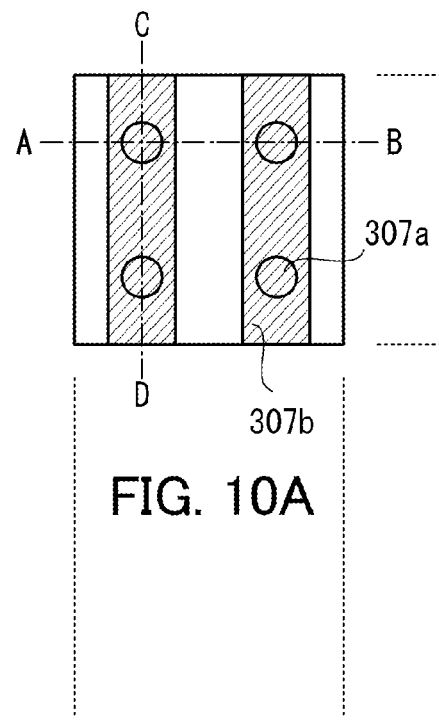
FIGS. 10A to 10D are diagrams illustrating the example of a process for manufacturing a semiconductor memory device of the present invention.
Figure 10B:
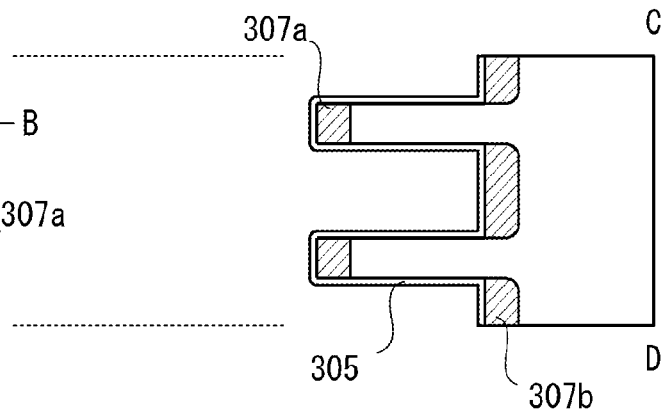
Figure 10C:
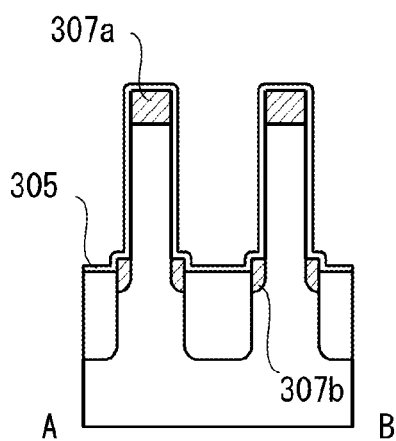
Figure 10D:
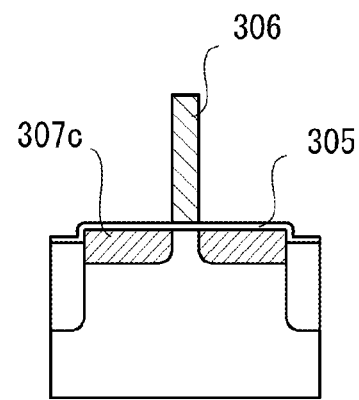
Figure 11A:
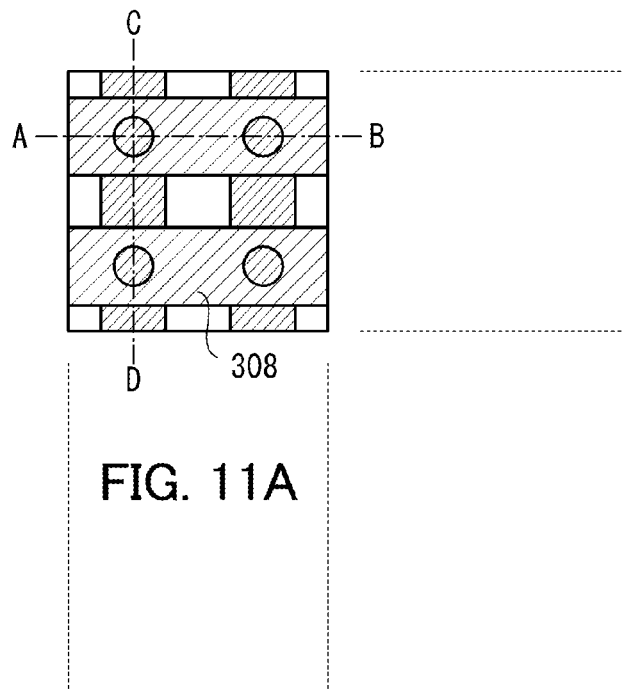
FIGS. 11A to 11D are diagrams illustrating the example of a process for manufacturing a semiconductor memory device of the present invention.
Figure 11B:
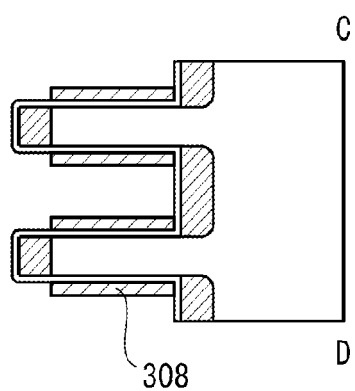
Figure 11C:
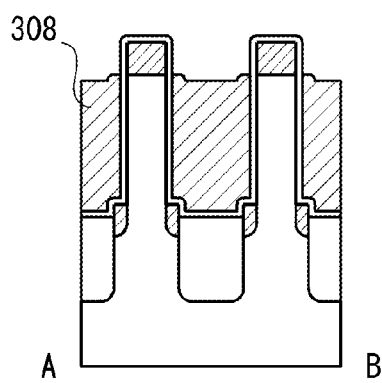
Figure 11D:
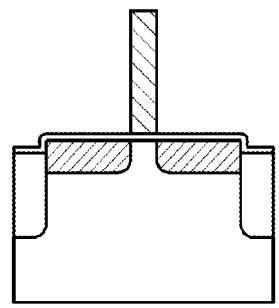

The substrate 301 and the element isolation region 302 are etched, whereby a portion covered with the mask 303 becomes a pillar 304. Note that etching rates of the substrate 301 and the element isolation region 302 are different in this etching step, so that a step may be generated at a boundary between the substrate 301 and the element isolation region 302, as shown in FIG. 9C.

<FIGS. 10A to 10D>

A gate insulator 305 is formed. Next, a gate wiring 306 is formed in the peripheral circuit portion (see FIG. 10D), and then doping is performed. Thus, in the memory cell, an upper impurity region 307a is formed at the top of the pillar 304, a lower impurity region 307b is formed in a region other than the pillar 304, and a peripheral circuit impurity region 307c is formed in the peripheral circuit portion.

<FIGS. 11A to 11D>

A first wiring 308 serving as a word line is formed. The first wiring 308 is formed to intersect with the element isolation region 302 (i.e., the lower impurity region 307b) in FIG. 11A, but the first wiring 308 may be provided in another direction. For example, the first wiring 308 may be provided in parallel to the element isolation region 302.

<FIGS. 12A to 12C>

A connection electrode 309, a capacitor 310, a second wiring 312a, a second wiring 312b, and the like are formed in or on an interlayer insulator 311. The second wiring 312b is a wiring of the peripheral circuit portion. When the second wiring 312a is formed to intersect with the first wiring 308, the second wiring 312a can be used as a bit line. In that case, the lower impurity region 307b may be used as a source line.

In this embodiment, the lower impurity region 307b serving as a source line is provided to intersect with the second wiring 312a serving as a bit line. Therefore, ideally, the potential of the lower impurity region 307b can be changed in accordance with the potential of the second wiring 312a as described in Patent Document 2. However, the resistance of the lower impurity region 307b is relatively high as compared with that of a metal material and the line width of the lower impurity region 307b is not sufficiently large, so that such a driving method cannot be achieved actually.

(Embodiment 4)

Figure 13A:
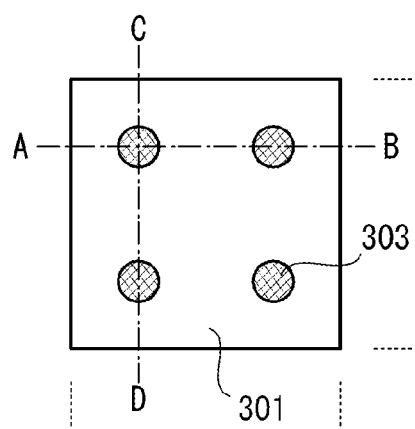
FIGS. 13A to 13D are diagrams illustrating an example of a process for manufacturing a semiconductor memory device of the present invention.
Figure 13B:
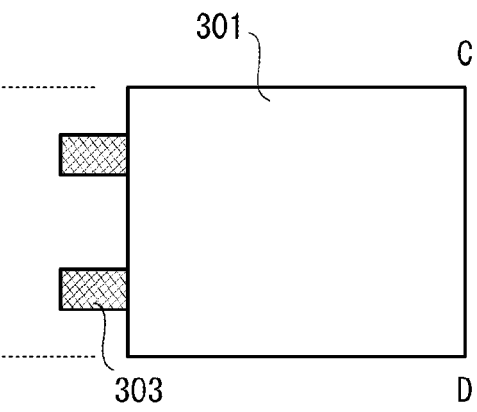
Figure 13C:
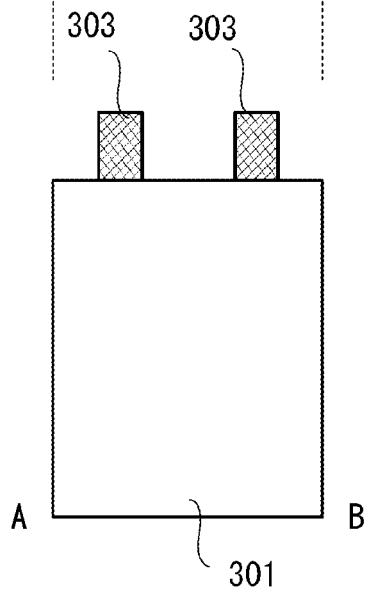
Figure 13D:
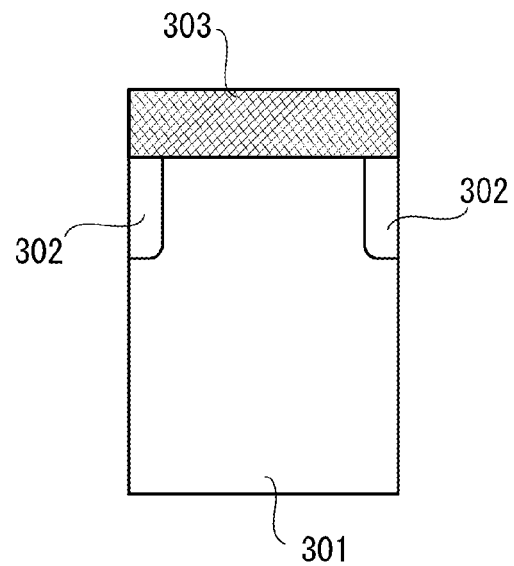
Figure 14A:
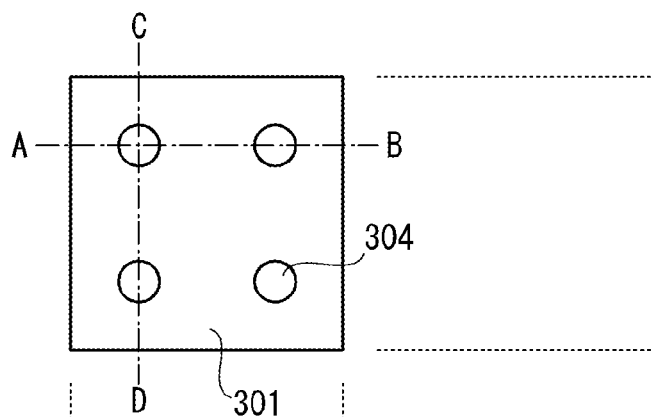
FIGS. 14A to 14D are diagrams illustrating the example of a process for manufacturing a semiconductor memory device of the present invention.
Figure 14B:
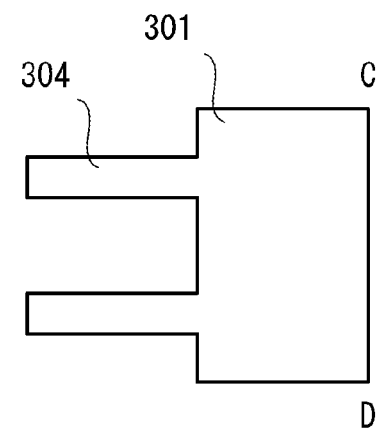
Figure 14C:
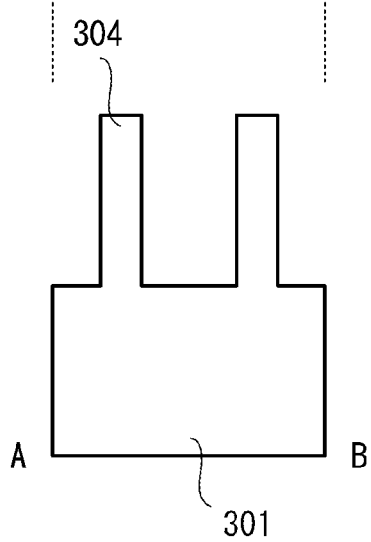
Figure 14D:
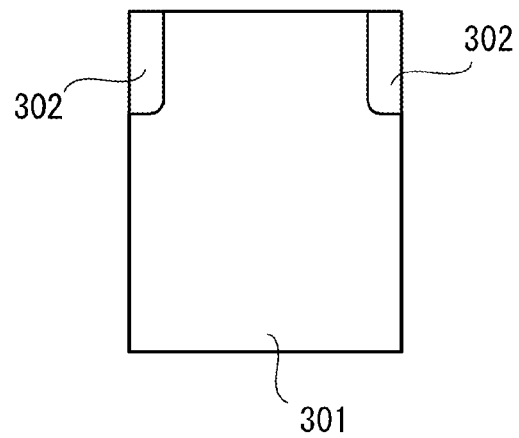
Figure 15A:
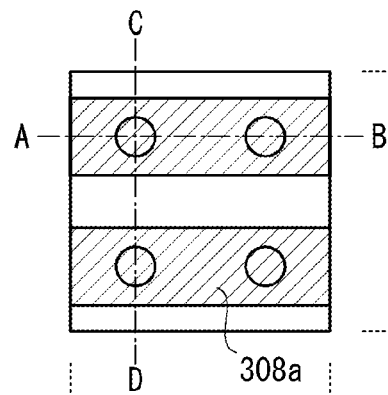
FIGS. 15A to 15D are diagrams illustrating the example of a process for manufacturing a semiconductor memory device of the present invention.
Figure 15B:
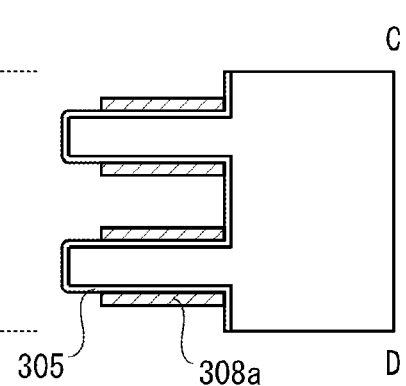
Figure 15C:
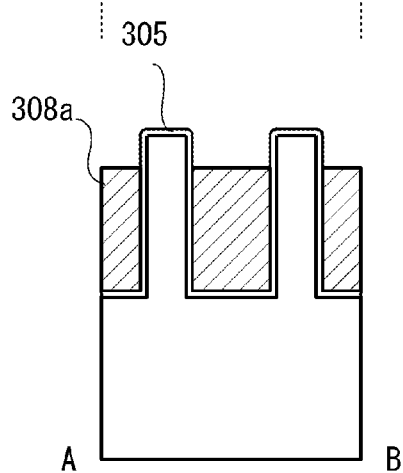
Figure 15D:
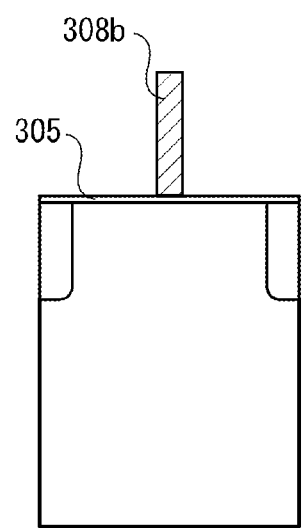
Figure 16A:
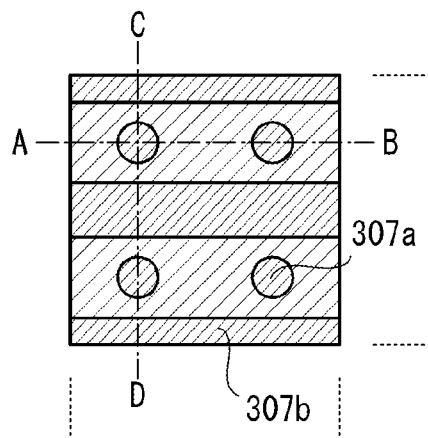
FIGS. 16A to 16D are diagrams illustrating the example of a process for manufacturing a semiconductor memory device of the present invention.
Figure 16B:
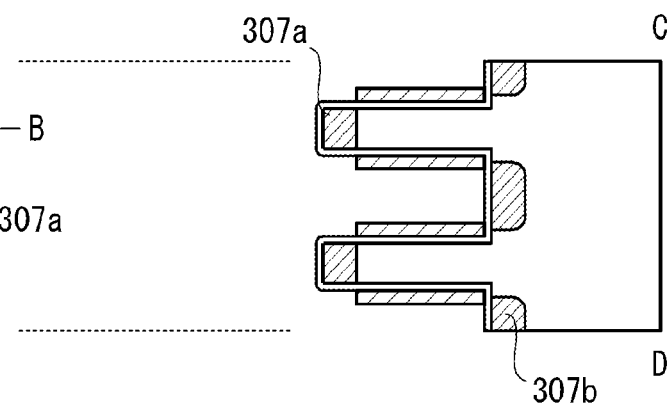
Figure 16C:
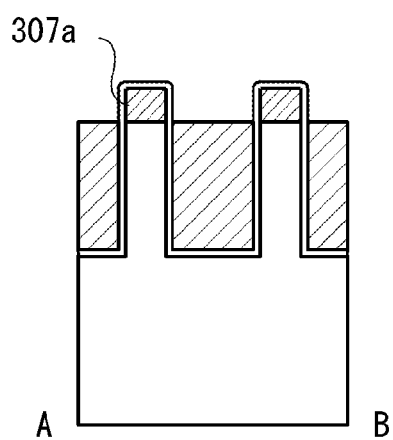
Figure 16D:
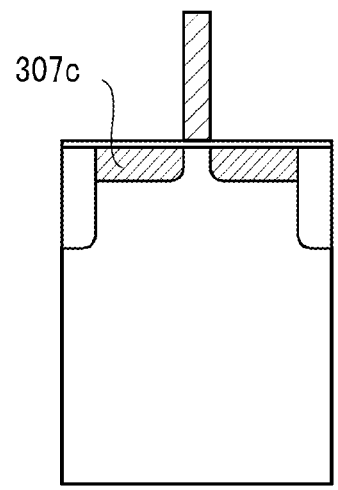
Figure 17C:
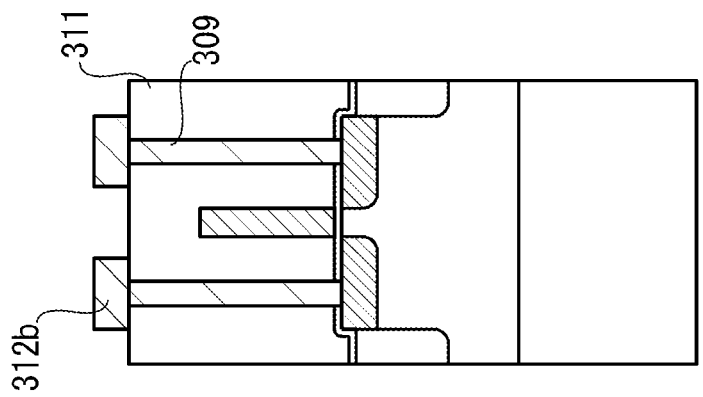
FIGS. 17A to 17C are diagrams illustrating the example of a process for manufacturing a semiconductor memory device of the present invention.
Figure 17B:
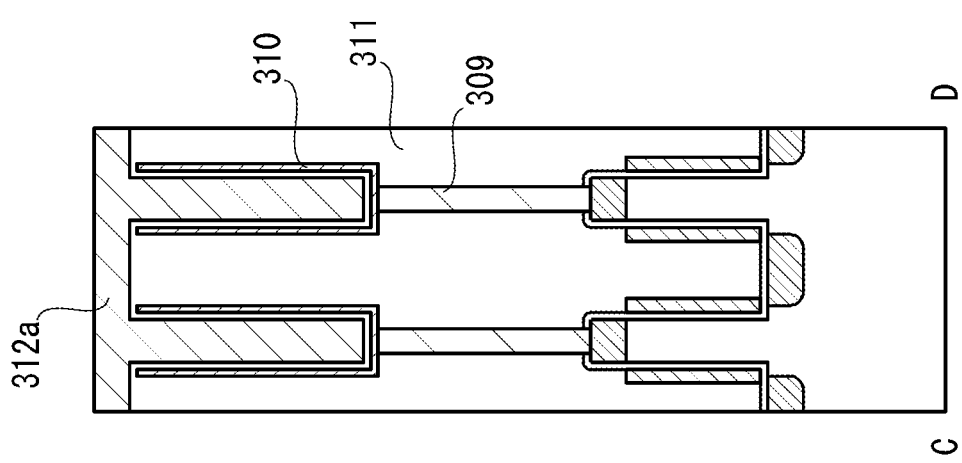
Figure 17A:
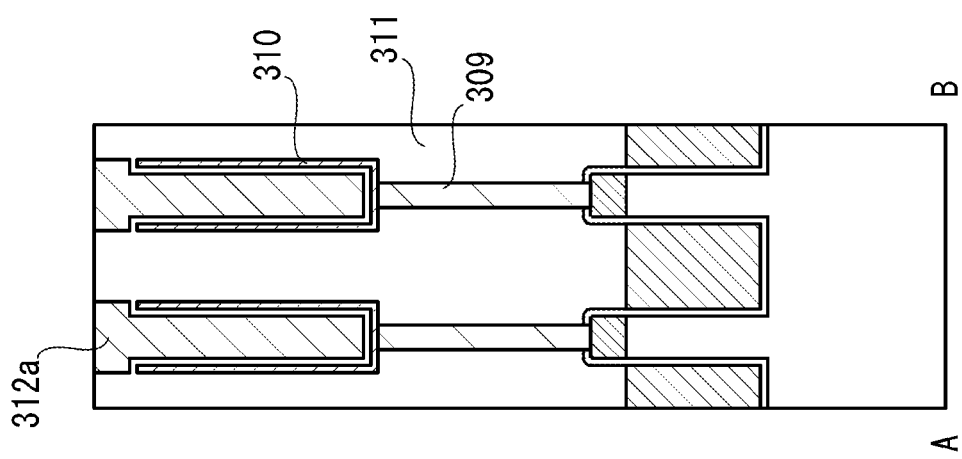

In this embodiment, a method for manufacturing a semiconductor memory device will be described with reference to FIGS. 13A to 13D, FIGS. 14A to 14D, FIGS. 15A to 15D, FIGS. 16A to 16D, and FIGS. 17A to 17C. Note that FIG. 13A illustrates four memory cells and the periphery thereof seen from the above. FIG. 13B illustrates a cross section taken along dashed-dotted line C-D in FIG. 13A. FIG. 13C illustrates a cross section taken along dashed-dotted line A-B in FIG. 13A. FIG. 13D illustrates a cross section of a transistor in the peripheral circuit portion. The same applies to FIGS. 14A to 14D, FIGS. 15A to 15D, and FIGS. 16A to 16D. FIG. 17A illustrates the cross section taken along dashed-dotted line A-B in FIG. 13A. FIG. 17B illustrates a cross section taken along dashed-dotted line C-D in FIG. 13A. FIG. 17C illustrates a cross section of a transistor in the peripheral circuit portion.

<FIGS. 13A to 13D>

The element isolation region 302 is formed on the substrate 301 formed with use of a semiconductor such as silicon. In this embodiment, the depth of the element isolation region 302 may be the same level as that in the usual semiconductor device. Further, the element isolation region 302 is not necessarily formed in the memory cell region. Then, the mask 303 is formed. The mask 303 is preferably formed to cover most part of the peripheral circuit portion.

<FIGS. 14A to 14D>

The substrate 301 is etched, whereby in a memory cell region, a portion covered with the mask 303 becomes the pillar 304. Note that in the memory cell region, the element isolation region 302 is not provided, and the peripheral circuit portion is covered with the mask 303 and thus is not etched; therefore, a step as in Embodiment 3 is hardly generated. Consequently, insufficient insulation of an insulating film (particularly, a gate insulator) can be prevented.

<FIGS. 15A to 15D>

After the formation of the gate insulator 305, a first wiring 308a and a first wiring 308b are formed. The first wiring 308a and the first wiring 308b may be formed with use of the same material in the same step. The first wiring 308a serves as a word line, and the first wiring 308b serves as a gate wiring of the peripheral circuit portion. Unlike in Embodiment 3, the gate wiring of the peripheral circuit portion and the word line can be formed at the same time, so that the number of manufacturing steps is decreased.

<FIGS. 16A to 16D>

Doping is performed. Thus, in the memory cell, an upper impurity region 307a is formed at the top of the pillar 304, a lower impurity region 307b is formed in a region other than the pillar 304, and a peripheral circuit impurity region 307c is formed in the peripheral circuit portion. The lower impurity region 307b can be used as a source line. Note that as seen from FIG. 16A, the source line (lower impurity region 307b) is formed in parallel to the word line (first wiring 308a).

The width of the lower impurity region in Embodiment 3 is partly narrowed due to the pillar, whereas the width of the lower impurity region 307b in this embodiment is constant. Therefore, when the lower impurity region 307b is used as a source line, the resistance of the source line can be low.

Among the impurity regions, the lower impurity region 307b and the peripheral circuit impurity region 307c can be formed of the first wiring 308a and the first wiring 308b in a self-aligned manner. Thus, an area in which the first wiring and the lower impurity region overlap with each other is smaller than that in Embodiment 3. Since the first wiring serves as a gate of a transistor, a channel of the transistor can be long and thus a short-channel effect can be suppressed, leading to improvement in characteristics of the transistor.

<FIGS. 17A to 17C>

A connection electrode 309, a capacitor 310, a second wiring 312a, a second wiring 312b, and the like are formed in or on an interlayer insulator 311. The second wiring 312b is a wiring of the peripheral circuit portion. The second wiring 312a is formed to intersect with the first wiring 308a so that the second wiring 312a is used as a bit line.

(Embodiment 5)

Figure 18A:
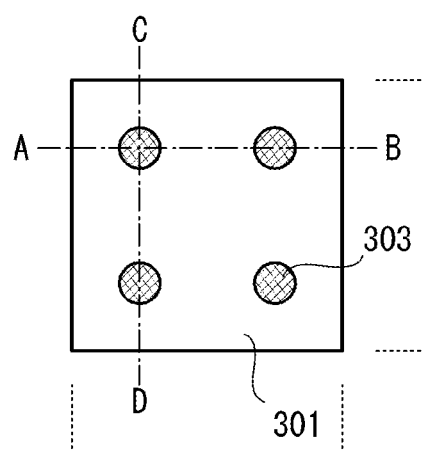
FIGS. 18A to 18D are diagrams illustrating an example of a process for manufacturing a semiconductor memory device of the present invention.
Figure 18B:
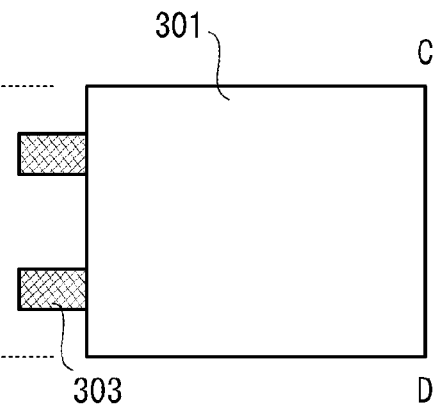
Figure 18C:
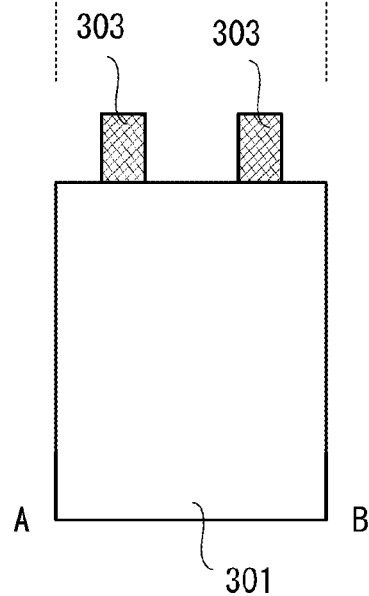
Figure 18D:
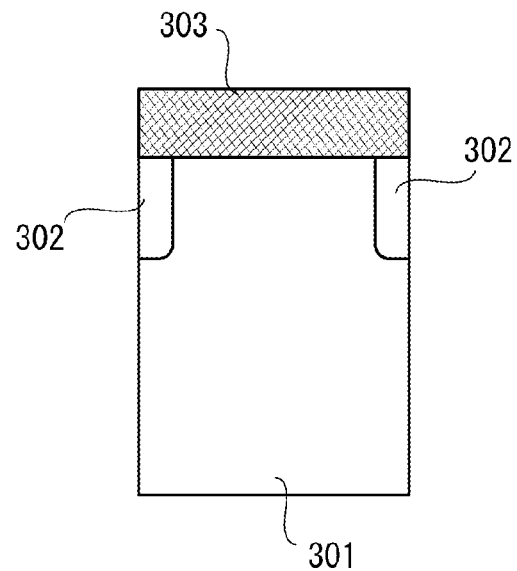
Figure 19A:
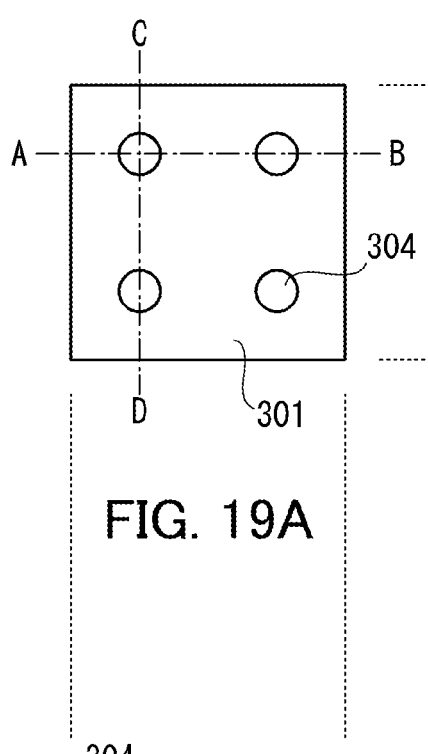
FIGS. 19A to 19D are diagrams illustrating the example of a process for manufacturing a semiconductor memory device of the present invention.
Figure 19B:
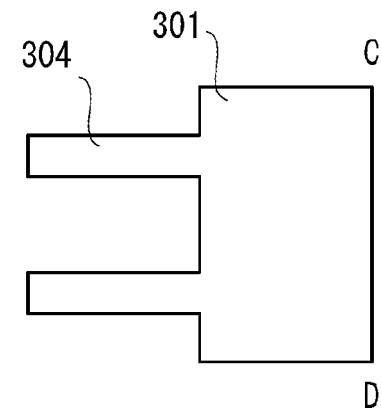
Figure 19C:
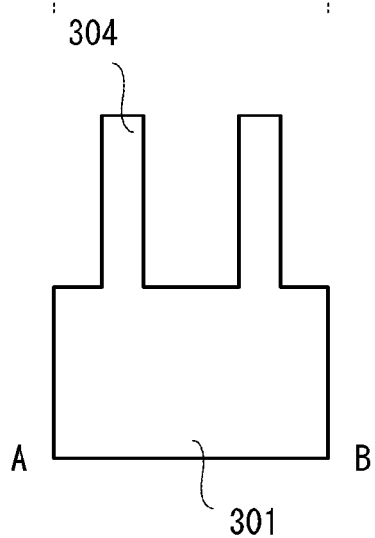
Figure 19D:
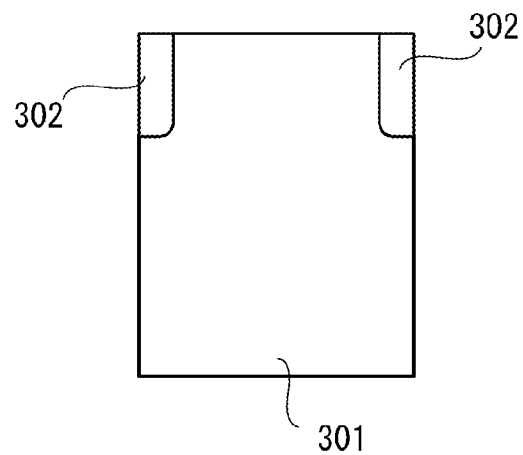
Figure 20A:
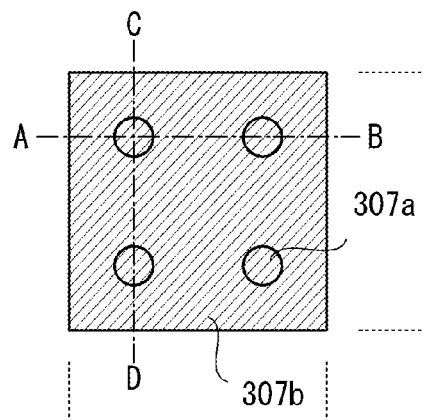
FIGS. 20A to 20D are diagrams illustrating the example of a process for manufacturing a semiconductor memory device of the present invention.
Figure 20B:
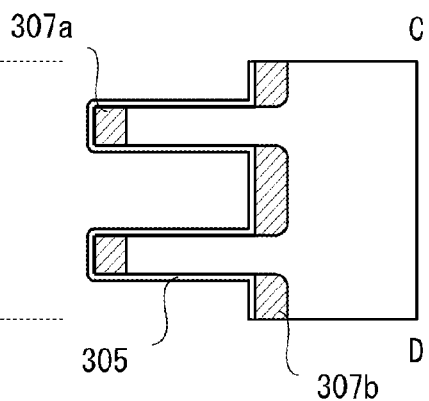
Figure 20C:
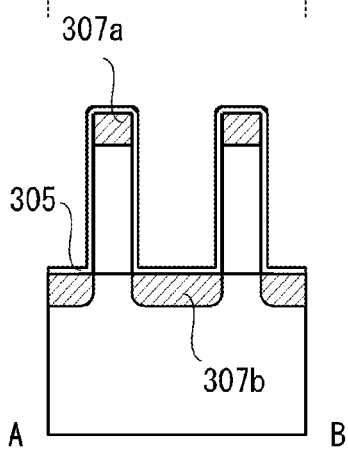
Figure 20D:
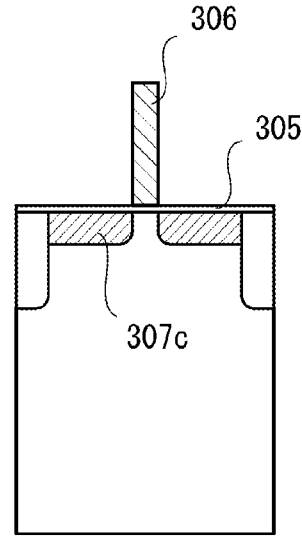
Figure 21A:
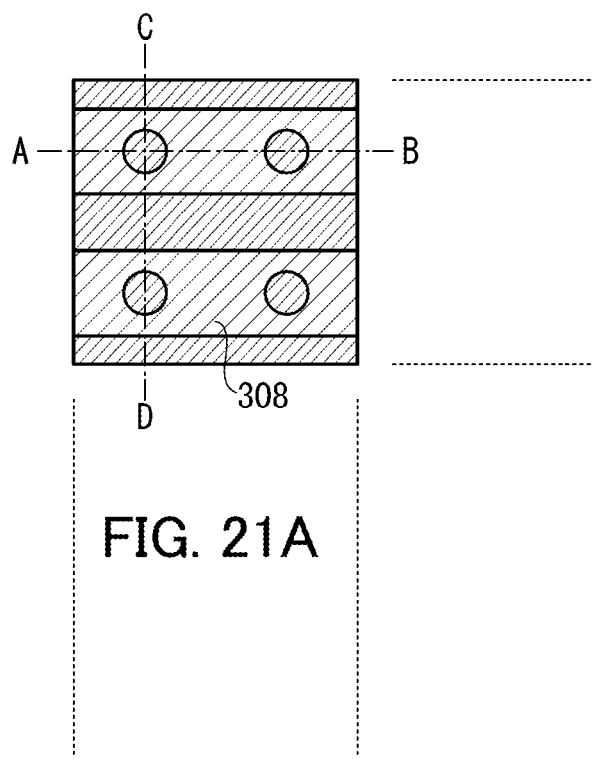
FIGS. 21A to 21D are diagrams illustrating the example of a process for manufacturing a semiconductor memory device of the present invention.
Figure 21B:
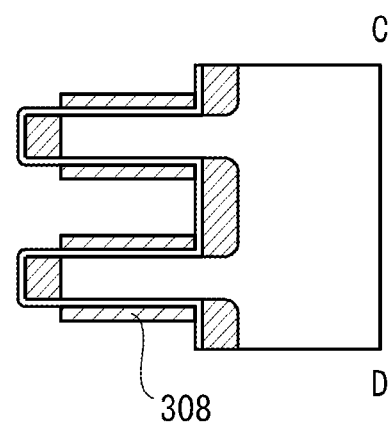
Figure 21C:
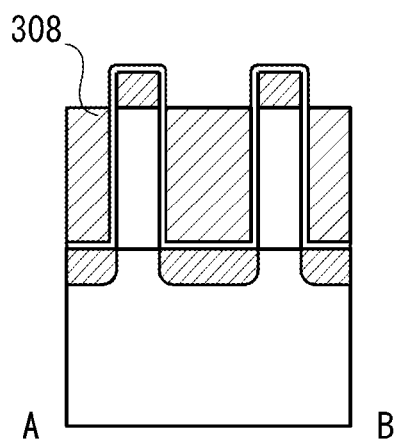
Figure 21D:
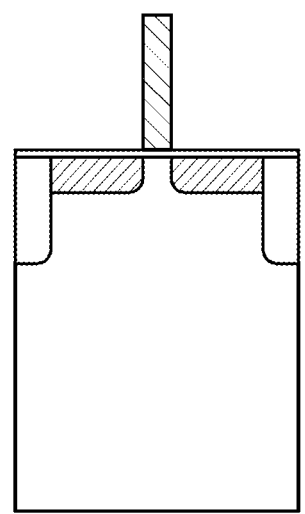

In this embodiment, a method for manufacturing a semiconductor memory device will be described with reference to FIGS. 18A to 18D, FIGS. 19A to 19D, FIGS. 20A to 20D, FIGS. 21A to 21D, and FIGS. 22A to 22C. Note that FIG. 18A illustrates four memory cells and the periphery thereof seen from the above. FIG. 18B illustrates a cross section taken along dashed-dotted line C-D in FIG. 18A. FIG. 18C illustrates a cross section taken along dashed-dotted line A-B in FIG. 18A. FIG. 18D illustrates a cross section of a transistor in the peripheral circuit portion. The same applies to FIGS. 19A to 19D, FIGS. 20A to 20D, and FIGS. 21A to 21D. FIG. 22A illustrates the cross section taken along dashed-dotted line A-B in FIG. 18A. FIG. 22B illustrates a cross section taken along dashed-dotted line C-D in FIG. 18A. FIG. 22C illustrates a cross section of a transistor in the peripheral circuit portion.

<FIGS. 18A to 18D>

The element isolation region 302 is formed on the substrate 301 formed with use of a semiconductor such as silicon. In this embodiment, the depth of the element isolation region 302 may be the same level as that in the usual semiconductor device. Further, the element isolation region 302 is not necessarily formed in the memory cell region. Then, the mask 303 is formed. The mask 303 is preferably formed to cover most part of the peripheral circuit portion.

<FIGS. 19A to 19D>

The substrate 301 and the element isolation region 302 are etched, whereby in a memory cell region, a portion covered with the mask 303 becomes the pillar 304. Note that in the memory cell region, the element isolation region 302 is not provided, and the peripheral circuit portion is covered with the mask 303 and thus is not etched; therefore, a step as in Embodiment 3 is hardly generated.

<FIGS. 20A to 20D>

After the gate wiring 306 is formed over the gate insulator 305 and in the peripheral circuit portion, doping is performed. Thus, in the memory cell, an upper impurity region 307a is formed at the top of the pillar 304, a lower impurity region 307b is formed in a region other than the pillar 304, and a peripheral circuit impurity region 307c is formed in the peripheral circuit portion. The lower impurity region 307b can be used as a source line. Unlike in Embodiments 3 and 4, the lower impurity region 307b of this embodiment extends in every direction and thus has a sufficient low resistance.

<FIGS. 21A to 21D>

The first wiring 308 serving as a word line is formed.

<FIGS. 22A to 22C>

A connection electrode 309, a capacitor 310, a second wiring 312a, a second wiring 312b, and the like are formed in or on an interlayer insulator 311. The second wiring 312b is a wiring of the peripheral circuit portion. The second wiring 312a is formed to intersect with the first wiring 308a so that the second wiring 312a is used as a bit line.

This application is based on Japanese Patent Application serial no. 2011-097821 filed with Japan Patent Office on Apr. 26, 2011, the entire contents of which are hereby incorporated by reference.

What is claimed is:

1. A semiconductor memory device comprising:
a bit line;
a capacitor electrically connected to the bit line;
a transistor electrically connected to the capacitor; and
a source line electrically connected to the transistor,
wherein the source line is parallel to the word line,
wherein a gate of the transistor is electrically connected to a word line, and
wherein the bit line is provided over the capacitor.

2. The semiconductor memory device according to claim 1, wherein the source line is electrically connected to a wiring parallel to the bit line.

3. The semiconductor memory device according to claim 1, wherein a capacitance of the capacitor is one to ten times as large as a gate capacitance of the transistor.

4. The semiconductor memory device according to claim 1, wherein an off-state resistance of the transistor is greater than or equal to $1\times10^{18}$ Ω.

5. A method for driving the semiconductor memory device according to claim 1, wherein a potential of the source line is invariant during data reading, data holding, and data writing.

6. A method for driving the semiconductor memory device according to claim 1,
wherein there is no difference in a potential of a drain of the transistor between after writing of one data and after writing of another data, and
wherein there is no difference in a potential of a source of the transistor between after writing of one data and after writing of another data.

7. A semiconductor memory device comprising:
a bit line;
a word line;
a source line; and
a memory cell comprising a cell transistor and a stack capacitor,
wherein a gate, a drain, and a source of the cell transistor are connected to the word line, one electrode of the stack capacitor, and the source line, respectively, and
wherein the bit line is formed over the stack capacitor.

8. The semiconductor memory device according to claim 7, wherein the source line is parallel to the word line.

9. The semiconductor memory device according to claim 7, wherein the source line is electrically connected to a wiring parallel to the bit line.

10. The semiconductor memory device according to claim 7, wherein a capacitance of the stack capacitor is one to ten times as large as a gate capacitance of the cell transistor.

11. The semiconductor memory device according to claim 7, wherein an off-state resistance of the cell transistor is greater than or equal to $1\times10^{18}$ Ω.

12. A method for driving the semiconductor memory device according to claim 7, wherein a potential of the source line is invariant during data reading, data holding, and data writing.

13. A method for driving the semiconductor memory device according to claim 7,
wherein there is no difference in a potential of the drain of the cell transistor between after writing of one data and after writing of another data, and
wherein there is no difference in a potential of the source of the cell transistor between after writing of one data and after writing of another data.

14. A semiconductor memory device comprising:
a bit line;
a word line;
a source line; and
a memory cell comprising a cell transistor and a stack capacitor,
wherein a gate, a drain, and a source of the cell transistor are connected to the word line, one electrode of the stack capacitor, and the source line, respectively,
wherein another electrode of the stack capacitor is connected to the bit line, and
wherein the bit line is formed over the stack capacitor.

15. The semiconductor memory device according to claim 14, wherein the source line is parallel to the word line.

16. The semiconductor memory device according to claim 14, wherein the source line is electrically connected to a wiring parallel to the bit line.

17. The semiconductor memory device according to claim 14, wherein a capacitance of the stack capacitor is one to ten times as large as a gate capacitance of the cell transistor.

18. The semiconductor memory device according to claim 14, wherein an off-state resistance of the cell transistor is greater than or equal to $1\times10^{18}$ Ω.

19. A method for driving the semiconductor memory device according to claim 14, wherein a potential of the source line is invariant during data reading, data holding, and data writing.

20. A method for driving the semiconductor memory device according to claim 14,
   wherein there is no difference in a potential of the drain of the cell transistor between after writing of one data and after writing of another data, and
   wherein there is no difference in a potential of the source of the cell transistor between after writing of one data and after writing of another data.

* * * * *